United States Patent [19]

Zemek et al.

[11] 4,245,385
[45] Jan. 20, 1981

[54] RADIAL LEAD COMPONENT INSERTION MACHINE

[75] Inventors: Albert W. Zemek, Windsor; Frederick G. Tomko, Vestal, both of N.Y.; Crawford Matson, Wyalusing; Burr Darrow, New Milford, both of Pa.

[73] Assignee: Universal Instruments Corporation, Binghamton, N.Y.

[21] Appl. No.: 56,076

[22] Filed: Jul. 9, 1979

Related U.S. Application Data

[62] Division of Ser. No. 907,564, May 19, 1978, Pat. No. 4,203,583.

[51] Int. Cl.³ .............................................. B23P 23/00
[52] U.S. Cl. ...................................... 29/564.8; 29/741
[58] Field of Search ................. 29/564.1, 564.6, 564.8, 29/33 M, 563, 564.3, 564.7, 741

[56] References Cited

U.S. PATENT DOCUMENTS

| | | | |
|---|---|---|---|
| 4,051,593 | 10/1977 | Mori et al. | 29/564.6 |
| 4,054,988 | 10/1977 | Masuzima et al. | 29/564.6 |

*Primary Examiner*—W. Donald Bray
*Attorney, Agent, or Firm*—Fidelman, Wolffe & Waldron

[57] ABSTRACT

Under direction of a machine controller, a traversing shuttle automatically selects one component among a plurality of radially leaded components stored on continuous component belts, centers the component, shears the selected component from the belt, and conveys the component to a pivotable insertion head. The insertion head clamps onto the component leads, pivots and inserts the component leads into predrilled holes in a positioned printed circuit board. A mechanism beneath the board, cuts the leads and clinches the shortened leads to the board. The board is repositioned and another radial lead component of the same or different type and electrical size is selected and the cycle is repeated. Different spacings of components on the storage belts and different lead spacings are automatically accommodated.

17 Claims, 39 Drawing Figures

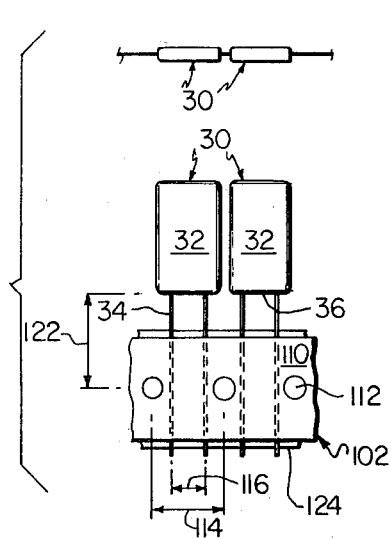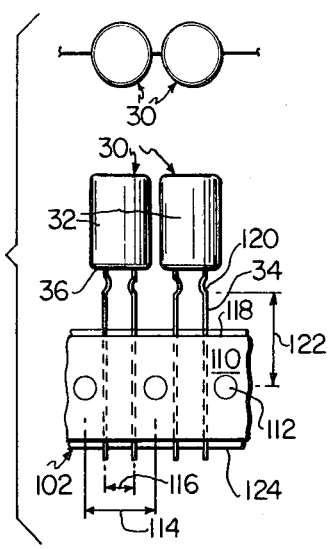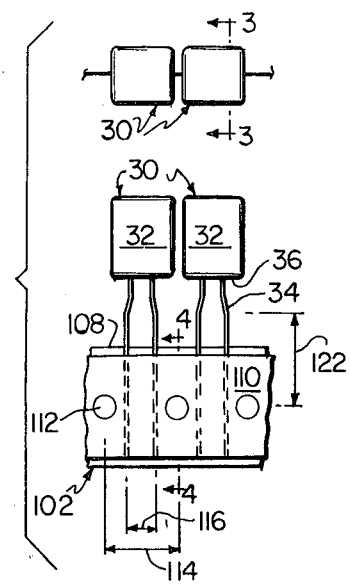
FIG. 2a FIG. 2b FIG. 2c
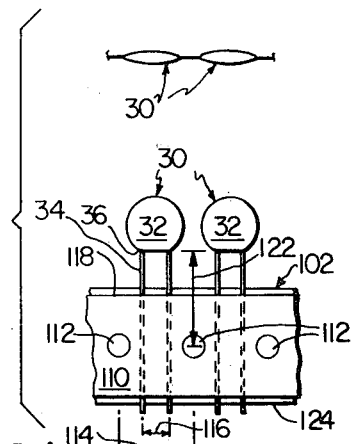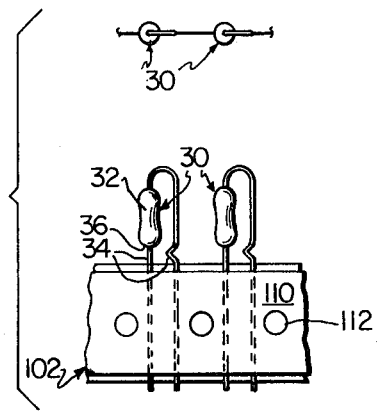
FIG. 2d FIG. 2e
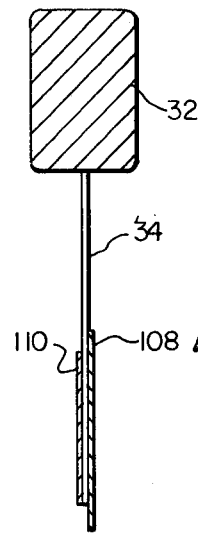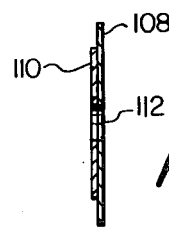
FIG. 3 FIG. 4

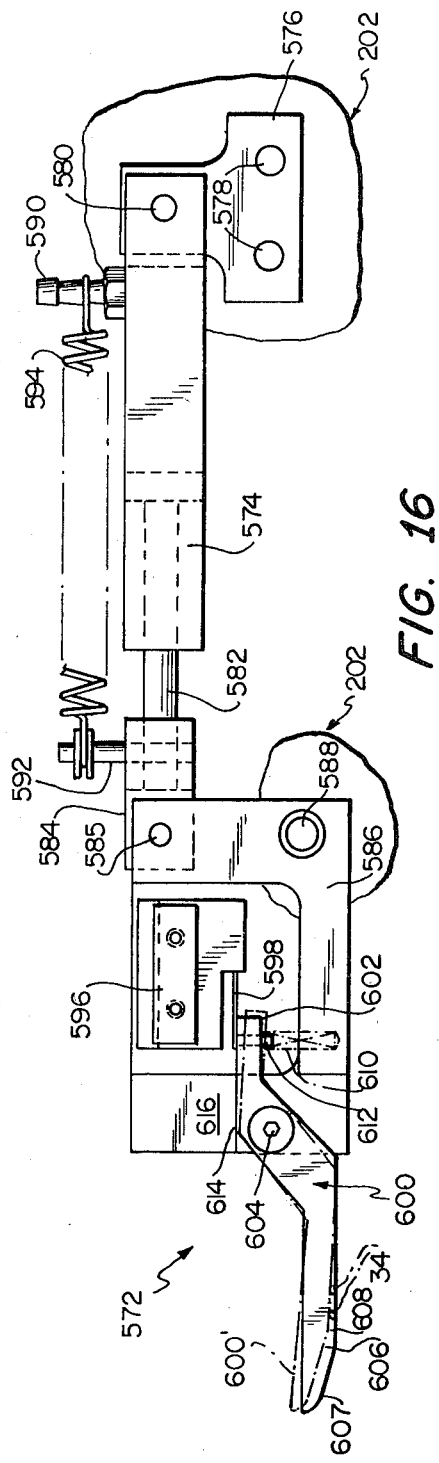
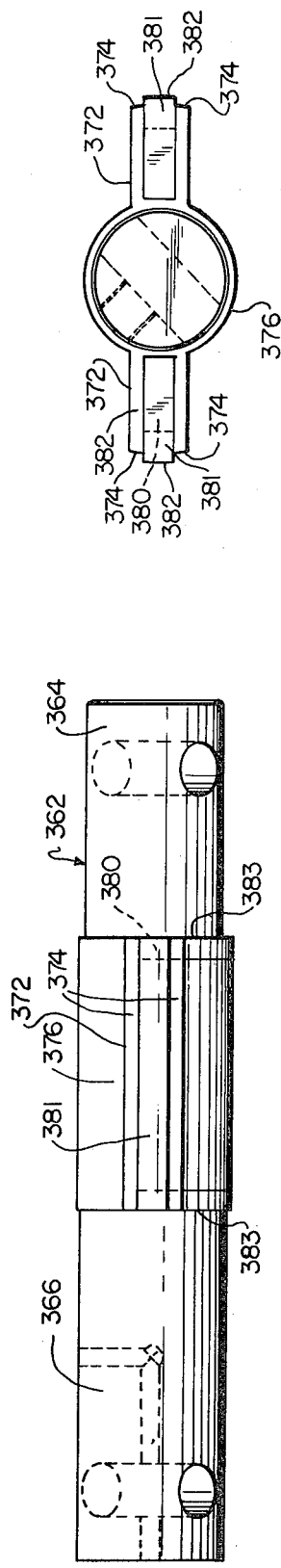

RADIAL LEAD COMPONENT INSERTION MACHINE

This is a divisional of application Ser. No. 907,564, filed May 19, 1978 now U.S. Pat. No. 4,203,583.

BACKGROUND OF THE INVENTION

The present invention relates generally to machinery for the insertion of electronic components into printed circuit boards and more particularly to an automated machine for the insertion in sequence of a variety of radial leaded components into a circuit board.

The use of printed circuit boards having pre-drilled holes or receptacles for receiving therein the extended leads of electronic components is well established in the electronics industry. The ever growing demand for such circuitry and the highly competitive nature of the industry have created a need for automation in all phases of circuit board assembly. Automated machines have been developed which arrange and retain axial leaded components, e.g. conventional resistors, of one size on continuous belts. These belts are used to feed component insertion machines which select a particular component from an assortment of component belts, form the leads and insert the leads in pre-drilled holes in a printed circuit board. In other applications, the component belts include components in a selected assortment of sizes, retained in a preferred sequence along the belt such that an insertion machine operating with as few as one storage belt can substantially populate a circuit board.

Such machines operating with components stored on continuous belts have been successfully developed for axial leaded components, that is, components having leads which extend substantially coaxially from opposite ends of generally symmetrical component bodies. The symmetry of the stored components simplifies to a degree the problems in developing a machine capable of inserting a variety of axial leaded components.

DIP components, that is those well known, well standardized components in the electronics industry having dual rows of parallel prongs extending from opposite sides of a rectangular body, also, because of their symmetry, lend themselves readily to use with automated machinery. The machines insert the prongs into receptacles mounted to the circuit board.

With both the axial lead and DIP insertion machines, the act of insertion is generally followed by automatic operations which cut off excess lead length from beneath the circuit board. Then the leads are bent to clinch them against the underside of the board so as to fix the components in position prior to subsequent operations, e.g. soldering.

A third type of component, that is the so-called radial leaded components, have leads which extend substantially parallel but not coaxially from the component body. Disc and film capacitors, transistors, induction coils, and the like are produced in abundance in the radial leaded configuration. Twin leads are most common but three and more radial leaded components, e.g. transistors, are available as standard items. However, unlike the DIP and axial leaded components there is little similarity to the physical size and shape of different types of radial leaded components. Accordingly, the difficulty and complexities involved in developing a single machine for the automated insertion of a variety of radial leaded components is substantially increased.

Radial leaded components are stored on flat carrier strips where the leads are taped to a stiff paper backing but the component body stands free of the carrier strip. Only the spacings between components on the carrier strip and the spacing of the leads where they are taped have been standardized to a substantial degree. The shape and height of different component types extending beyond the carrier strip differ markedly, making it difficult to have a universal insertion machine for many radial leaded component types.

Problems associated with all insertion machines further intensify as circuit boards, mounted components and the physical spacing between components become smaller. This trend toward compactness of the circuit assemblies requires that the "footprint" of the machine on the circuit board when components are inserted be minimized so that the machine does not damage components already in place. In this regard, it is well understood that accuracy in aligning the component leads with the proper holes in the circuit board prior to insertion is an absolute requisite of every circuit machine if the components are to be inserted without damage.

In the prior art, machines for insertion of radial leaded components in circuit boards have generally gripped the body of the component at the time of aligning the leads to the circuit board holes. Ths method of holding the component body requires that the gripping mechanism be tailored to a particular component type and contour and thus limits the utility of the machine without modification to accommodate mixed components. Examples in the prior art of body-gripping insertion machines for radial leaded components are found in U.S. Pat. Nos. 2,896,208; 3,151,387; 3,257,711; 3,777,350 and 4,051,593.

SUMMARY OF THE INVENTION

The radial lead component insertion machine of this invention is comprised of a storage unit containing electronic components, an X-Y positioning platform for retaining a printed circuit board thereon for population with components, a shuttle travelling with components between the storage devices and the pickup area in the vicinity of the X-Y positioning platform; an insertion head which removes components from the shuttle and mounts them on the circuit board; and cut and clinch devices which act beneath the circuit board to trim the component leads to length and bend them against the undersurface of the circuit board.

Varied electronic components having radial leads are maintained in prepackaged strip form in an ordered array of the storage devices. One type and size of component is stored in each storage device. The translatable shuttle, having access to the component strip in every storage device, is directed by an automatic controller to a particular feed chute where the shuttle draws forth a single component from a selected storage device. The shuttle can operate without modification on intermixed components which are stored at either of the standard strip spacings used generally in the component industry. The selected component remains integral with the component strip which joins it to the other components in that particular storage device until the shuttle translates. Then translation of the shuttle causes the strip to be severed. The shuttle carries the separated portion of the strip including one component to the pickup area in the vicinity of the circuit board which is fixed in position on the X-Y positioning platform.

At this point, the pivotable insertion head reaches out to grasp the leads of the electronic component between laterally-adjacent jaws. Simultaneously, the connecting strip material is removed from the component by cutting the leads to a preferred length. Then the insertion head pivots to bring the component, with leads down, directly over the controller-selected openings in the printed circuit board. The insertion head descends to insert the leads in the openings; while simultaneously, a pusher rod pushes down on the top of the component body to complete insertion as the grip on the leads is released and the jaws swing away.

A pair of cut and clinch devices, located beneath the circuit board which is being populated, support the board during insertion and cut and clinch the leads following insertion to assure retention of the component on the board.

Means are provided in the insert head to rotate the grasped component such that the component leads may be parallel, as required, to either an X or Y axis of the circuit board at the time of insertion. The cut and clinch devices rotate in unison so as to be in position to perform their operation for each component orientation.

After insertion of a component, the circuit board is relocated to receive another component by the X-Y positioning platform, and the shuttle translates to the same or another storage device to select another component as the controller directs.

An object of the present invention is the provision of a radial lead component insertion machine which operates without modification and automatically with a variety of intermixed electronic component sizes and body contours.

A further object of the present invention is the provision of a radial lead component insertion machine which grasps components by their radial leads for insertion.

Another object of the present invention is to provide an insertion machine which orients components prior to insertion.

Still another object of the present invention is to provide a machine which cuts and clinchs the component leads after insertion.

A still further object of the present invention is to provide a machine which operates with components packaged in strips having different pitch spacings between stored components.

Other objects, advantages, and novel features of the present invention will become apparent from the following detailed description of the invention when considered in conjunction with the accompanying drawing in which:

FIG. 1 is a front elevation of the insertion machine of this invention.

FIGS. 2a–e illustrate in front elevation and top views some types of electronic components utilized with the insertion machine of FIG. 1 and the carrier strip used in storage.

FIG. 3 is a sectional view along the line 3—3 of FIG. 2c.

FIG. 4 is a sectional view along the line 4—4 of FIG. 2c.

FIG. 9b is a top view of the leaf spring of FIG. 9a.

FIG. 14 is a sectional view taken along the line 14—14 of FIG. 13a.

FIG. 16 is a backside view to an enlarged scale of the component detector assembly of FIG. 10.

Figure 15:
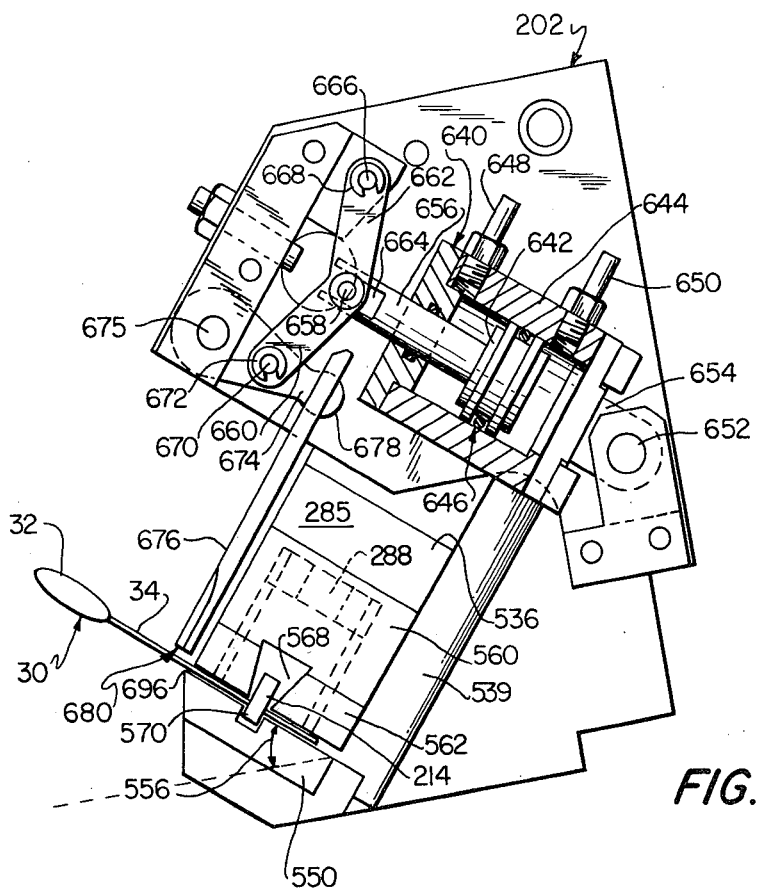
FIG. 15 is an end view of the shuttle and linkage mechanism of FIG. 13b taken along the shuttle interface with the pulling finger extended across the interface.
Figure 17A:
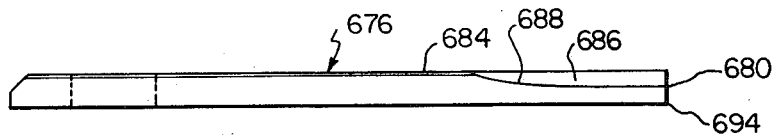

FIGS. 17a and b are front elevation and end views respectively of the cutter of FIG. 15.

Figure 1:
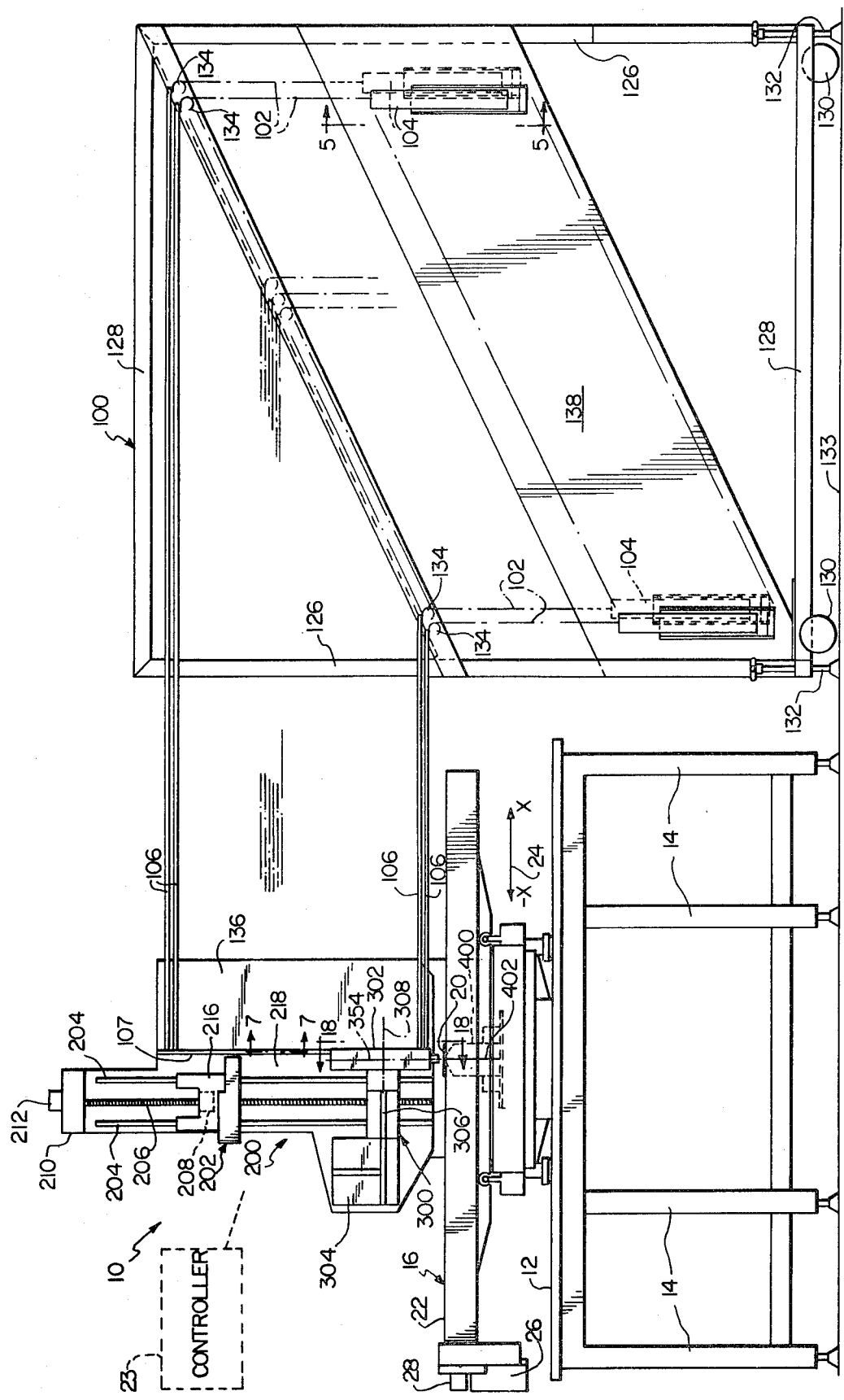
Figure 18:
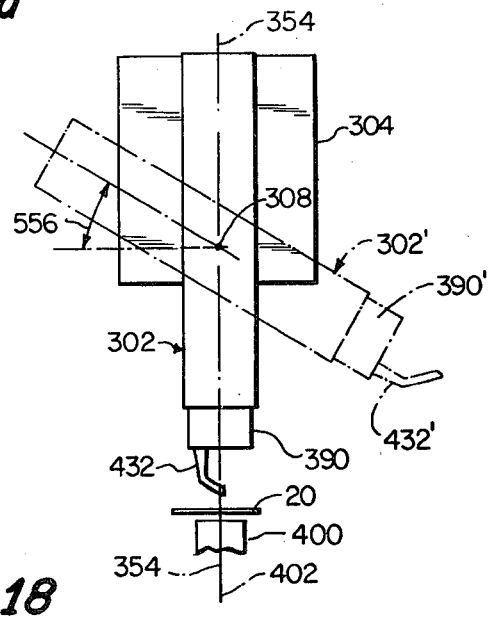

FIG. 18 is a view of the insertion head taken along the line 18—18 of FIG. 1.

Figure 19A:
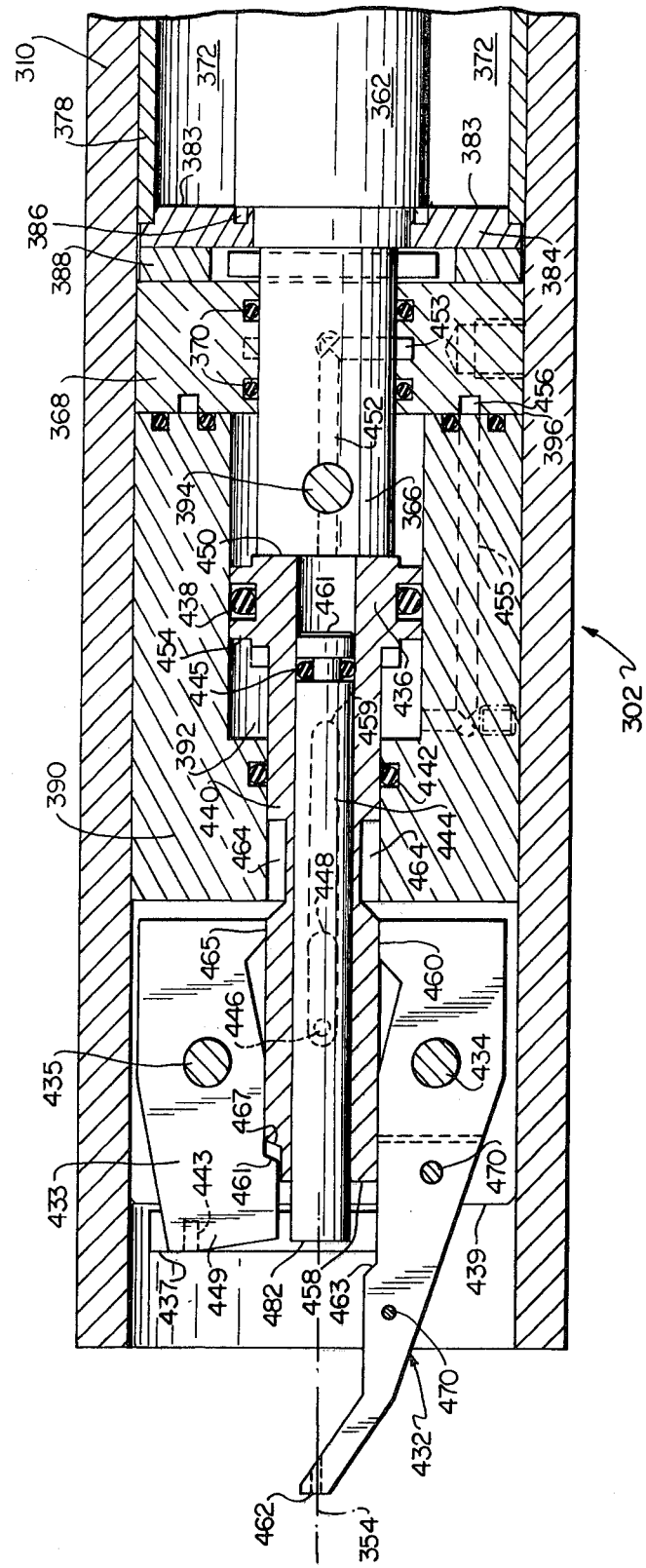

FIGS. 19a and b are longitudinal axis crossection views of the insertion head assembly of FIG. 1.

Figure 19B:
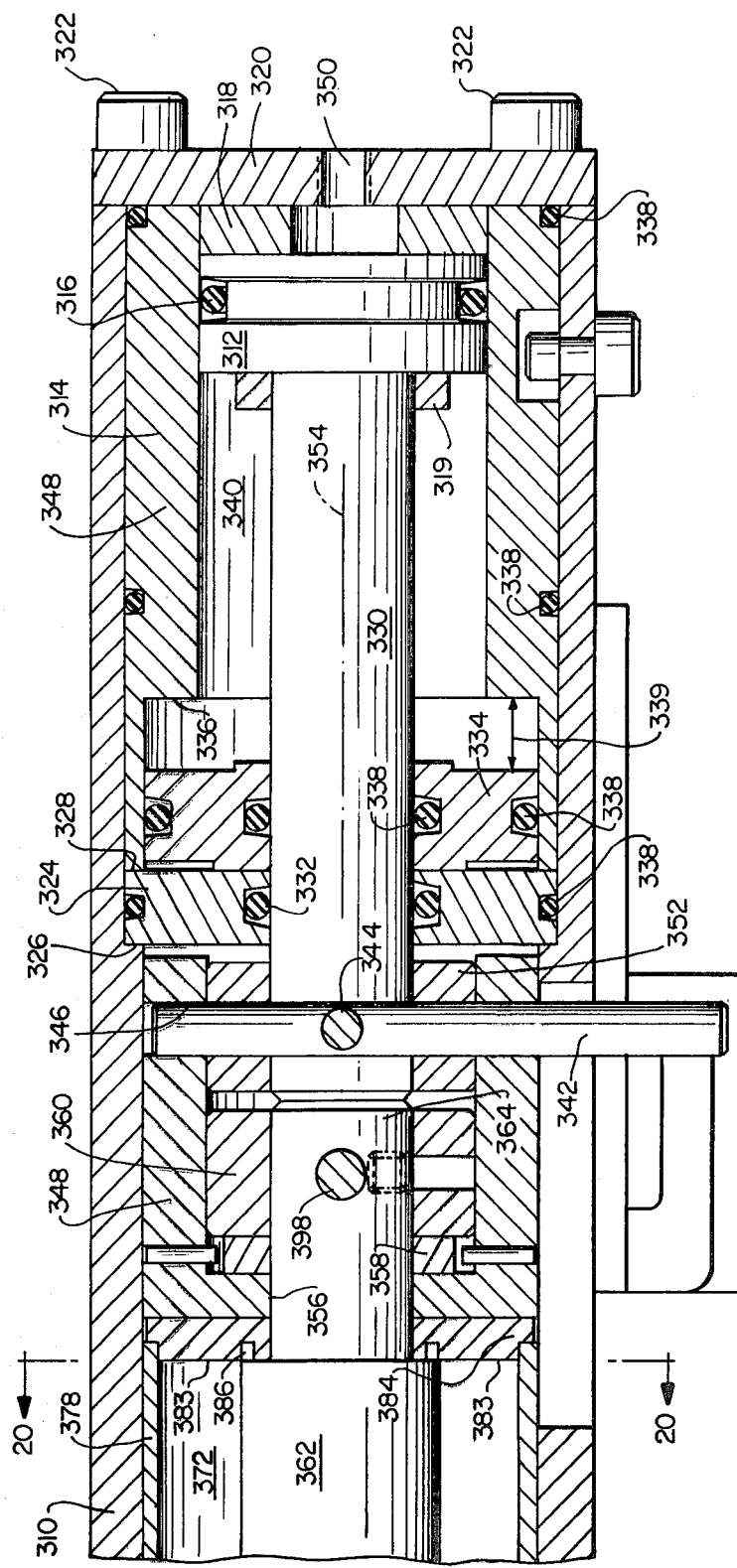
Figure 20:
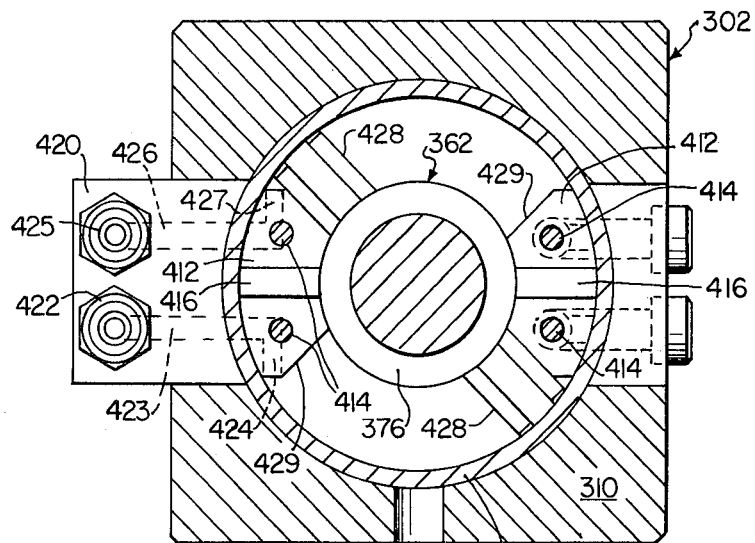

FIG. 20 is a view taken along the line 20—20 of FIG. 19.

FIGS. 21a and b are the side and end views respectively of the vaned shaft of FIG. 19.

Figure 22:
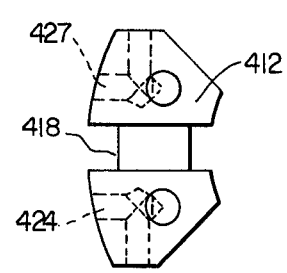

FIG. 22 is an end view of the block of FIG. 20.

Figure 23A:
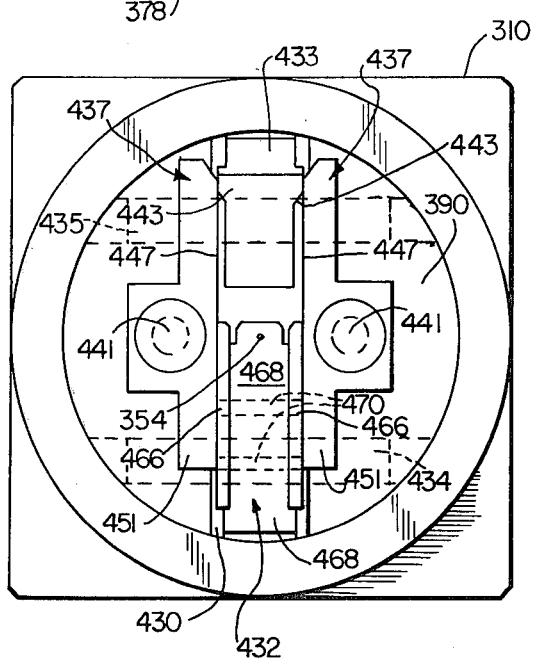

FIG. 23a is an end view of the insertion head showing the component grippers.

Figure 23B:
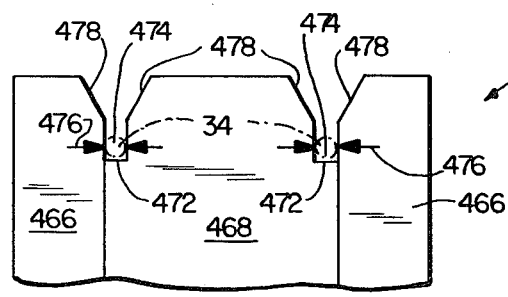

FIG. 23b is an enlarged portion of FIG. 23a.

Figure 24:
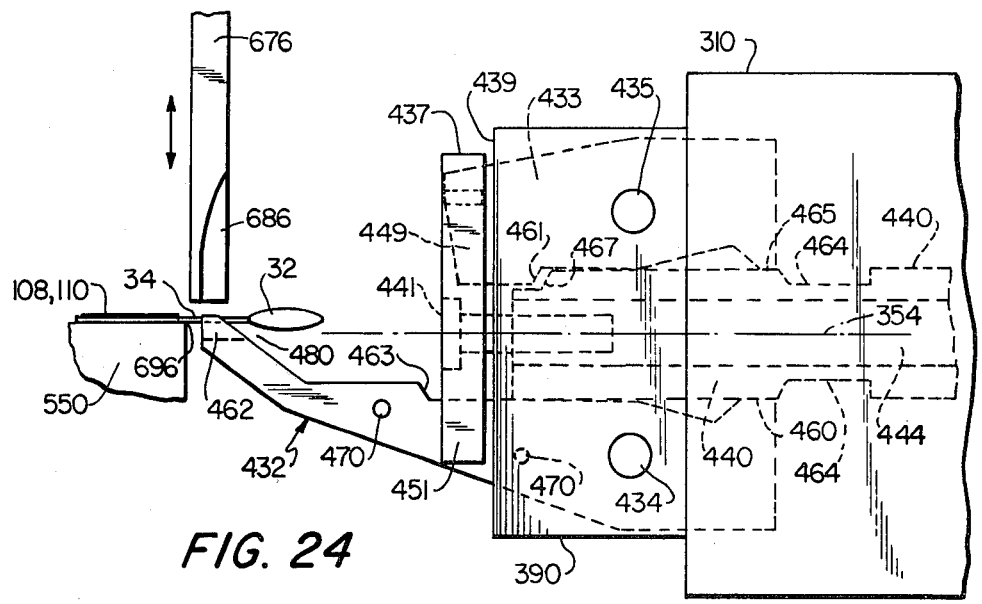

FIG. 24 shows the headpiece of FIG. 19 extended from the insertion head.

Figure 25:
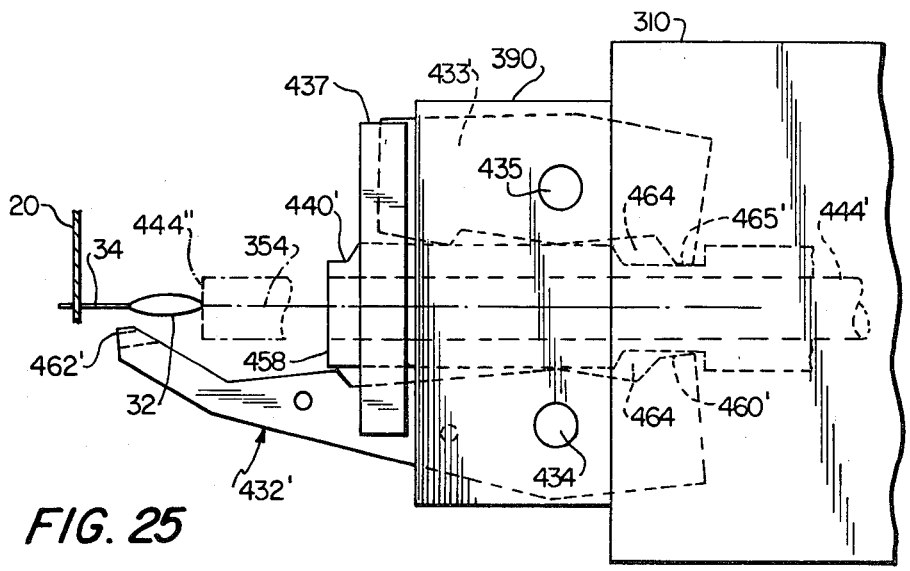

FIG. 25 is a view similar to FIG. 24 with the jaws pivoted away from the longitudinal axis.

Figure 26:
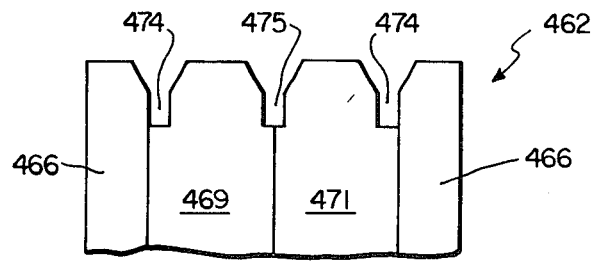

FIG. 26 is a view similar to FIG. 23b and showing an alternative embodiment.

DESCRIPTION OF THE INVENTION

With reference to FIG. 1, the radial lead component insertion machine 10 of this invention comprises a horizontal platform 12 supported on a plurality of platform legs 14 upon which rests an X-Y positioning platform assembly 16. A printed electronic circuit board 20 rests on the horizontal platform 22 of the X-Y positioning platform assembly 16 and is rigidly but removably attached thereto. The platform 22 with the affixed printed circuit board 20 is driven as commanded by the controller, generally indicated in broken lines and identified by the number 23, in the X directions 24 by a precision horizontal lead screw (not shown). Rotation of the lead screw is produced by the motor drive unit 26 and the X position of the X-Y platform 22 is sensed and fed back to the controller 23 by a transducer-decoder 28 coupled to the precision drive shaft. A similar lead screw drive unit, and decoder, assembly (not shown) provide and monitor motion of the X-Y platform 22 in the Y directions. The nature and operation of X-Y platforms are well known, are not a novel part of this invention, and need no further detailed description here.

A storage unit 100 stands to the right of (FIG. 1) and adjacent to the X-Y positioning platform assembly 16, extending away generally in the X direction. Within the storage unit 100 are stored a mixed assortment of radial lead electronic components 30, each individual size and type of component 30 being retained on a component strip 102 and stored in an individual reel 104. Each strip 102 from a reel 104 is fed to an individual horizontally directed feed chute 106 which provides components 30 at the interface 107 with the vertical shuttle assembly 200 as explained hereinafter.

FIGS. 2–4 illustrate several typical radial leaded components 30 retained on component strips 102 for storage. The component strips 102 are comprised of a backing strip 108 of relatively stiff paper and a front sheet 110 of paper, e.g., masking tape, having an inner adhesive surface (not shown). The radial leads 34 of the components 30 are sandwiched between the thick paper backing strip 108 and the adhesive front sheet 110 and retained thereon with the leads 34 being generally transverse to the strip 102. The backing strip 108 and front sheet 110 are of substantially equal width and extended length and the component strips 102 including components 30 are stored on reels 104 as aforesaid. It should be noted that only one size and type of component 30 is stored on a single component strip 102 and reel 104.

As shown for the sake of illustration in FIGS. 2a, b, c, d, and e component bodies 32 can have many different sizes and contours. Nevertheless, there are industry standardized features incorporated in both components 30 and strips 102. Each component strip 102 has a series of equispaced, equisized perforations 112 which divide the strip 102 into spaces within which one component 30 is centered. The pitch distance 114 between perforations 112 is constant for the entire length of the component strip 102. Pitch distances 114 of one inch and one-half inch are standards in the electronic component industry and will be used in the disclosure which follows. However, it will be apparent that the insertion machine 10 of this invention can readily be modified to accommodate component strips 102 having other pitch distances 114.

The spacing 116 between leads 34 on a component 30 is also standardized by the industry and is limited to a few values. The lead spacing 116 refers to the position of the leads 34 where they enter between the layers 108, 110 along the upper edge 118 of the component strip 102. The leads 34 may be straight (FIGS. 2a, d), or for example, converged inwardly toward the body 32 (FIG. 2c), or with indented shoulders 120 (FIG. 2b). Nevertheless, the distance 122, extending from the perforations 112 toward the component body 32, in which both leads 34 run straight and parallel is maintained within relatively restricted limits by the industry regardless of the overall height, shape and size of the component 30. The component leads 34 may extend beyond the lower edge 124 of the component strip 102 (FIGS. 2a, b, and d) or can be generally flush with the lower edge 124 (FIG. 2c), or may not reach the lower edge 124.

The vertical shuttle assembly 200 is comprised of the shuttle 202 which translates vertically, sliding along a pair of vertical, round guide rails 204, when driven by a precision lead screw 206. The precision lead screw 206 engages the ball nut device 208 which is rigidly attached to the shuttle 202. The lead screw 206 is rotated by the motor 210 and the vertical position of the shuttle 202 is monitored by an encoder 212 which senses the degree of rotation of the motor 210 and lead screw 206 as the shuttle moves in response to instructions provided by the automatic controller 23. In operation, the shuttle 202 directed by the controller 23 moves to a position at the interface 107 adjacent to a component feed chute 106 containing a component 30 which is next required for insertion in the printed circuit board 20 on the X-Y platform assembly 16. As explained more fully hereinafter, the shuttle 202 extends a pulling finger 214 (FIG. 13) into the aligned chute 106. The finger 214 engages a perforation 112 and draws the component strip 102 into the shuttle 202 by a distance sufficient to bring a single component 30 on the strip 102 across the interface 107. The portion of the strip 102, with a single component 30, is clamped within the shuttle 202, and then is severed from the remainder of the strip 102 in the feed chute 106. The shuttle 202 descends vertically on the guide rails 204 to its lowest elevation and presents the strip portion with the selected component 30 at the pickup area adjacent to the component insertion head assembly 300.

The component insertion head assembly 300 includes the insertion head 302 which, as explained hereinafter, pivots on a horizontal axis 308 and in cooperation with the shuttle 202 grasps the leads 34 of the selected electronic component 30 clamped in the shuttle 202. During the grasping action of the insertion head 302, the component 30 is completely severed from the remains of the retaining component strip 102. Then the shuttle 202 is translated upward on the guide rails 204 to select another component 30, as the controller 23 directs, from any one of the plurality of component feed chutes 106 whose outlets align with the interface 107.

Concurrently with the upward departure of the shuttle 202, the insertion head 302, grasping the leads 34 of the electronic component 30, pivots to a vertical position, placing the component 30 directly over the printed circuit board 20 with the component leads 34 extending downward from the component body 32. The X-Y positioning platform 22 has already been located by the controller 23 in the known manner such that the predrilled holes in the printed circuit board 20 which are intended to receive the grasped component 30 are aligned to the extended component leads 34. The insertion head 302 moves the component 30 downward inserting the component leads 34 through the predrilled holes in the circuit board 20.

Concurrently with the downward motion of the component 30, a cut and clinch mechanism 400 located beneath the printed circuit board 20 moves upwardly to bend the protruding leads 34 against the underside of the circuit board 20 and to cut the leads 34 to a desired length.

When clamped in the shuttle 202, and subsequently grasped by the insertion head 302, both component leads 34 lie transversely to the X axis 24. Accordingly after the insertion head 302 has pivoted to the vertical position, as described above, the component 30 is inserted in holes in the circuit board which are parallel to the X axis 24. When the circuit board wiring configuration requires that a component 30 be oriented away from the X axis 24, for example, parallel to the Y axis, the component 30 is rotated while grasped by the insertion head 302, while simultaneously the cut and clinch mechanism 400 rotates by a corresponding amount. Accordingly, when the component 30 is inserted, the cut and clinch mechanism 400 is again in position to operate on the component leads 34.

STORAGE UNIT 100

Figure 5:
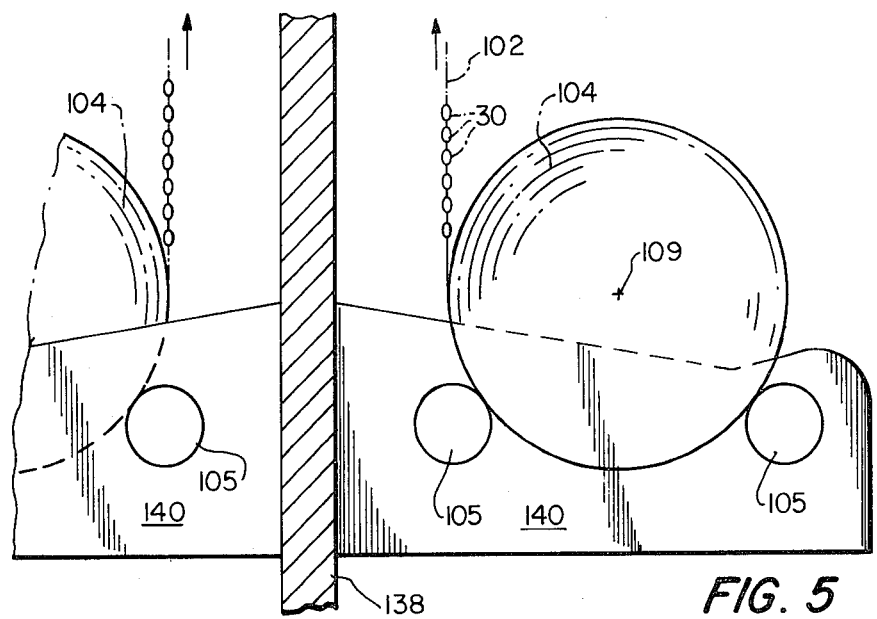
FIG. 5 is a partial view taken along the line 5—5 of FIG. 1.

As seen in FIGS. 1 and 5, the storage unit 100 is comprised of a three dimensional framework including upright angle members 126 and horizontal members 128, as well as lateral members (not shown) which together create a generally rectilinear storage volume. Round reels 104 containing component strips 102 are stored side by side in an ascending array (FIG. 1). The reels 104 are supported on rollers 105 mounted to brackets 140 for rotation of the reels 104 about axes 109 parallel to the plane of the drawing, FIG. 1. The entire storage unit framework is mounted on wheels 130 for mobility in bringing a loaded storage unit 100 into place for machine operation. Jacks 132 at the corners of the framework lift the wheels 130 off the floor 133 and provide mechanical stability during machine operation.

Figure 6:
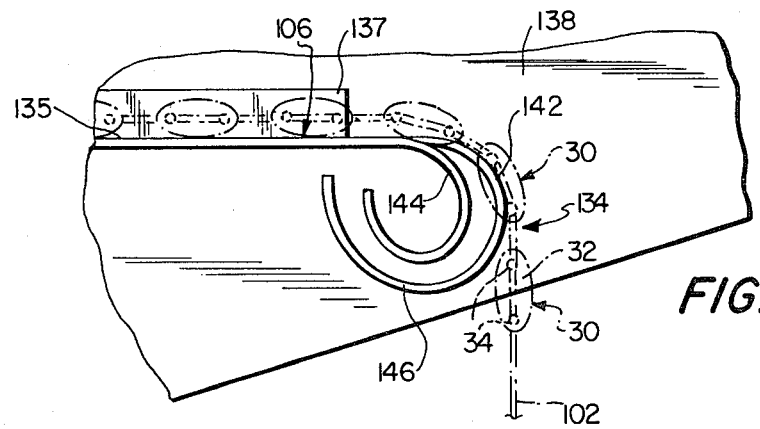
FIG. 6 is a detailed segment to an enlarged scale of the feed chutes of FIG. 1.

Generally horizontal and parallel feed chutes 106, open at their outer edges extend laterally from the interface 107 between the vertical shuttle assembly 200 and the storage unit 100. The uppermost feed chute 106 extends from the interface 107 to terminate substantially over the most elevated, righthand (FIG. 1) positioned reel 104. The chute 106 terminates in a downward curl 134 (FIG. 6) and the component strip 102, indicated in FIG. 1 by a broken line, rises vertically from the reel 104, slides over the curl 134, and lies on the upper surface 135 of the chute 106. The component strip 102 extends continuously to the interface 107. The reels 104, located in a progressively lower array from right to left (FIG. 1), are aligned to the end curl 134 of individual horizontal chutes 106 of differing lengths so that all component strips 102 rise substantially vertically through an equal distance from the reel 104 to meet the chute 106. Reels 104 are stored on both sides of a partition 138 which divides the storage unit 100.

Figure 7:
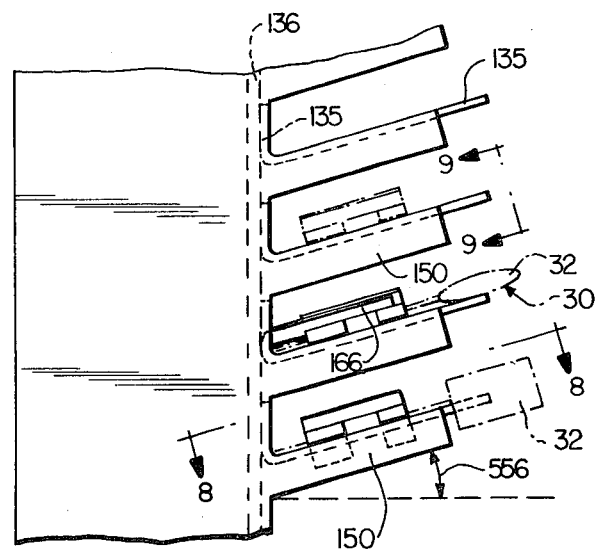
FIG. 7 is a view to an enlarged scale taken along the line 7—7 of FIG. 1.

At the interface 107 the open ends of all feed chutes 106 are equispaced one from the other and aligned to the interface 107. Each chute 106 is fixedly attached to a backing plate 136 (FIGS. 7, 8) attached to the frame structure 126, 128 such that the entire storage unit 100 including the reels 104 and feed chutes 106 is mobile on its wheels 130 and separable from the shuttle assembly 200 at the interface 107.

The feed chutes 106 provide sloping support (FIG. 7) for the component strip 102, which aided by gravity rests with the component leads 34 downward against a turned up back flange 137 (FIG. 3) of the chute 106 which in turn is attached to the backing plate 136. The component bodies 32 in the chute 106 are elevated somewhat above the lead ends. The curl 134 at one end of the feed chutes 106 is split longitudinally (FIG. 6) with the inner portion 142, closest to the partition 138, having a larger radius of curvature than does the outer curl portion 144. When a component strip 102 is threaded over a curl 134 during loading of the storage unit 100, the component leads 34 slide along the inner convex surface of the larger portion 142. Simultaneously the lower edge 36 of the component 30 slides against the edge surface 146 of the larger portion 142 while the component body 32 itself slides over the convex surface of the smaller curl portion 144. Thus the split curl 134 properly positions the component strip 102 on the chute 106 with the leads 34 adjacent the back flange 137 and the partition 138, and the component body 32 visible in the chute channel. The backing plate 136 adjacent the interface 107 is a smooth continuation of the partition 138 adjacent the component reels 104.

A rectilinear cutter block 150 of hardened material, e.g. tungsten carbide, is attached to each chute 106 adjacent the interface 107 between the storage unit 100 and the vertical shuttle assembly 200. The cutter block attachment is made to vertical tabs 152 at the ends of the chutes 106 by any suitable means (not shown) e.g. brazing or using nut and bolt. The upper surface 154 of the cutter block 150 is flush with the upper surface 135 of the chute 106 and the outward vertical surface 156 of the cutter block 150 lies on the interface 107 and serves as a shear in cutting the component strip 102 as explained more fully hereinafter.

Figure 8:
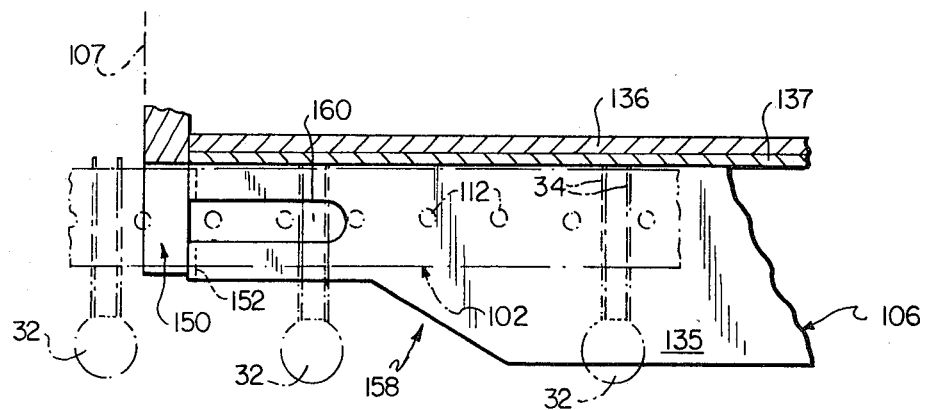
FIG. 8 is a view with parts omitted, taken along the line 8—8 of FIG. 7.
Figure 9A:
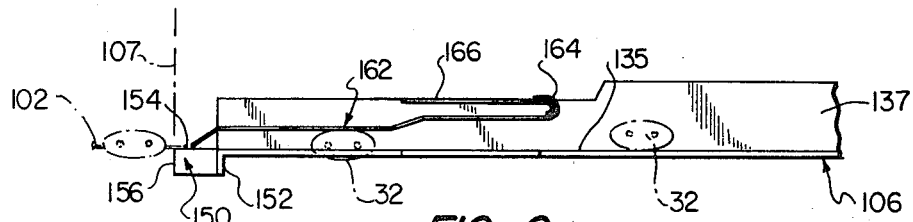
FIG. 9a is a view taken along the line 9—9 of FIG. 7.
Figure 9B:
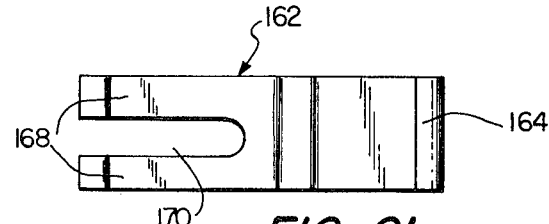

As shown in FIGS. 8 and 9, the chute 106 has a notch 158 in its horizontal surface 135 such that components 30 when positioned adjacent the notch 158 have the component bodies 32 unsupported while the component leads 34, held between the backing strip 108 and front sheet 110, are still supported on the horizontal chute surface 135. An elongated slot 160 in the chute surface 135 exposes the perforations 112 in the component strip 102 from beneath. A bifurcated leaf spring 162 has a curl 164 at one end (FIGS. 9a, b) which engages a horizontal flange 166 extending from the back flange 137 of the chute 106. The fingers 168 of the spring 162 extend to the cutter block 150 and turn downward to ride on the cutter's upper surface 154. The spring 168 is normally flexed and the fingers 168 exert a continuing force on the cutter block 150. When the component strip 102 is riding in the chute 106, the fingers 168 of the spring 162 press the backing strip 108 and front sheet 110 into proper position against the upper surface 154 of the cutter 150 and hold the adjacent following components 30 against the upper surface 135 of the chute. Thus the position of a component 30 is controlled as it approaches the interface 107. The slot 170 in the leaf spring 162 aligns with the row of perforations 112 and the slot 160 in the chute 106 so that the perforations are accessible from above. For the sake of clarity in illustration the spring 162 is not shown in FIG. 8.

VERTICAL SHUTTLE ASSEMBLY 200

Figure 10:
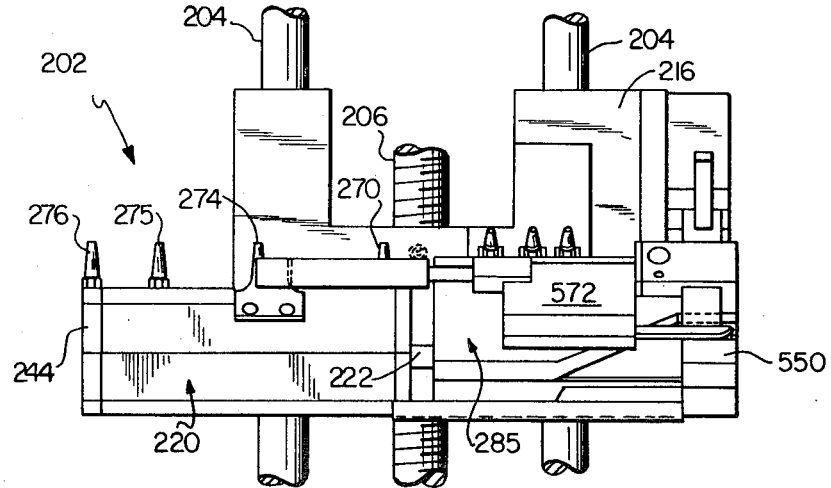
FIGS. 10 and 11 are elevation and top views respectively with parts omitted of the shuttle.
Figure 11:
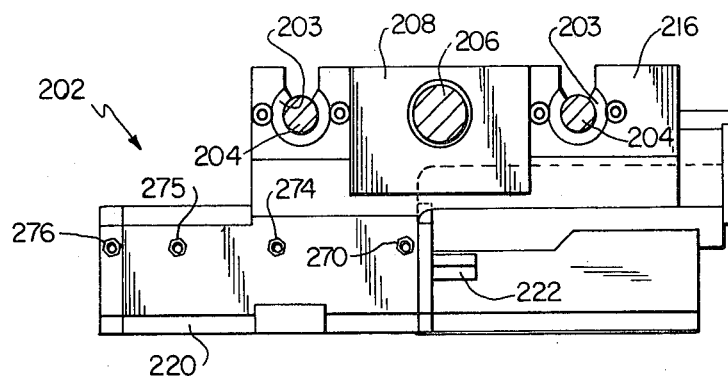

The vertical shuttle assembly 200 is comprised of the shuttle 202 which is slidingly mounted on bearings 203 for translation vertically along the pair of round guide rails 204 (FIGS. 10, 11). The precision lead screw 206, which is rotated by the motor 210, engages a ball nut device 208 rigidly attached to the shuttle block 216. The motor 210 and guide rails 204 are rigidly fixed to a mounting plate 218. Because of the engagement between the lead screw 206 and ball nut device 208, the shuttle block 216 rises vertically when the motor 210 rotates the lead screw 206 in one direction and descends when the motor 210 and lead screw 206 rotate in the opposite direction.

The drive assembly 220 is mounted to the shuttle block 216 and has a translatable drive shaft 222 extending from one end toward the interface 107. Internally (FIG. 12) the drive assembly 220 has three cylindrical chambers 224,226,228 aligned along a common axis 230. The right hand chamber 228 includes a cylindrical sleeve 232, a right hand stop 234 and a center stop 236. The middle chamber 226 includes the aforesaid center stop 236, cylindrical sleeve 238, and the left cylinder stop 240. The left chamber 224 includes the aforesaid stop 240, sleeve 242 and end plate 244. The cylinder stops 234,236,240 and sleeves 232,238,242 are press-fitted within a bore hole 246 passing through a common housing 248. The cylinder stops 234,236,240 extend between the sleeves 232,238,242 to contact the bore surface within the housing 248. The sleeves 232,238,242 differ in length such that the chamber lengths differ accordingly; the relationships between all sleeves and stops and the length of the chambers are fixed by the end plate 244 and end cap 250 which are attached to the housing 248 by any suitable fastening means (not shown).

The drive shaft 222 which extends through the stop 234 and end cap 250, is rigidly attached to the drive piston 252 located slidingly in the right chamber 228. The center shaft 254 extends through the middle stop 236 and is rigidly connected to the center piston 256 located slidingly in the middle chamber 226. The end 258 of the center shaft 254 may contact the drive piston 252 as explained hereinafter but the shaft 254 and piston 252 are unconnected. The left shaft 260 extends through the left stop 240 and is rigidly connected to the left piston 262 located slidingly in the left chamber 224. The shaft 260 is not fixedly connected to the middle piston 256.

"O" rings 264 seal the pistons against the wall sleeves; "O" rings 266 seal the shafts to the stops, and O rings 268 seal the stops and ends 244,250 against the housing 248 such that each chamber 224,226,228 is isolated from the others and outleakage from the drive assembly 220 is prevented. A nipple fitting 270 enables entry of pressurized gas into the right chamber 228 to the right of the drive piston 252 via a passageway 272 through the housing 248 and right stop 234. A similar nipple fitting 274 and passageway 279 allow entry of pressurized gas to the left side of the drive piston 252. Nipple fittings 275, 276 and passageways 277,278 allow entrance of pressurized gas to the left side (FIG. 12) of the pistons 256,262 respectively.

Figure 12:
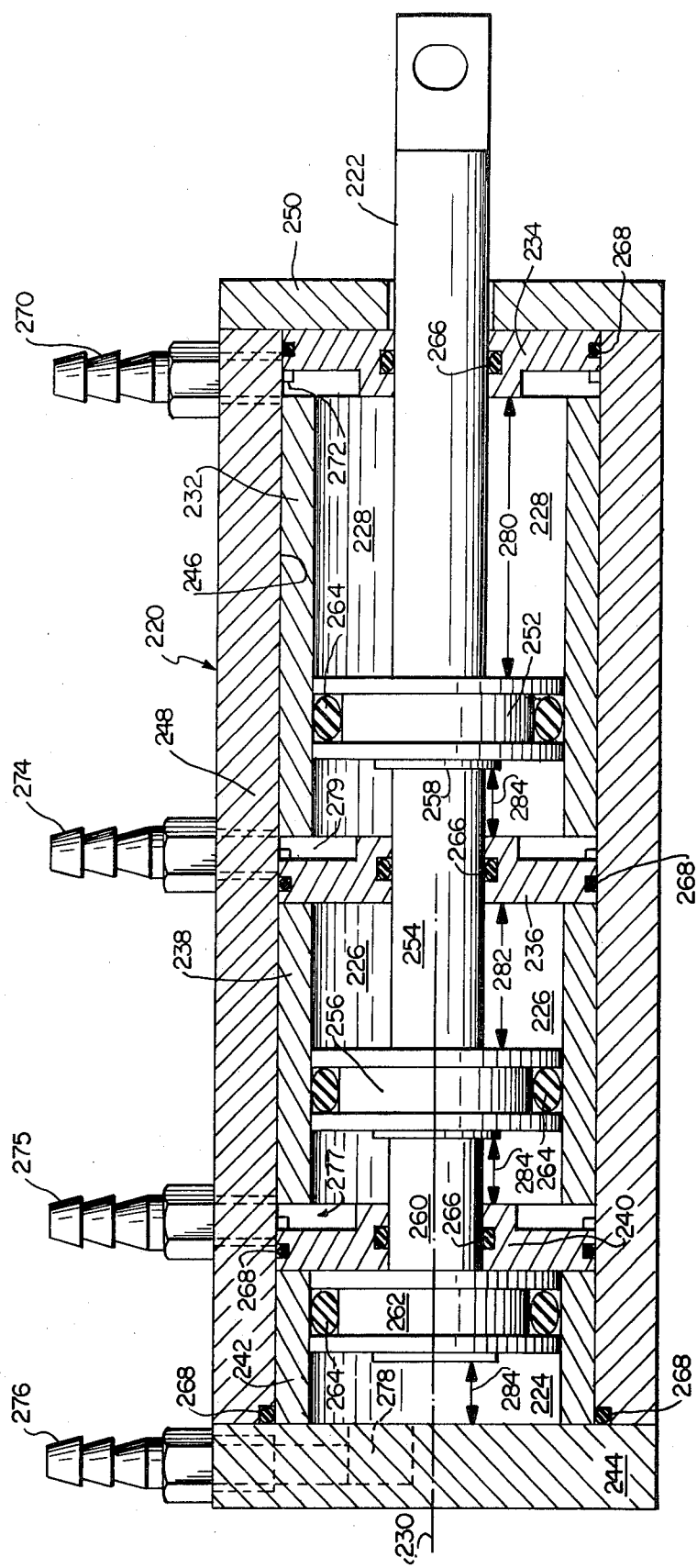
FIG. 12 is a sectional view of the drive assembly of FIGS. 10 and 11.

As constructed the drive assembly 220 is suited for operation with individual component strips 102 having one of two pitch distances 114 of perforations 112. For purposes of this disclosure, two standard pitch distances 114, namely, ½ inch and one inch will be described. As shown in FIG. 12 the length 280 of the right hand chamber 228 equals one pitch distance 114, namely, one inch, and the length 282 of the middle chamber 226 equals the other pitch distance 114, namely, one-half inch. The lengths 284 to the left of the pistons 252,256,262 are each equal to ¼ inch.

The drive shaft 222 is connected by a linkage mechanism 285 described hereinafter, to the elongated pulling finger 214. When the drive shaft 222 moves to the right (FIG. 13) the pulling finger 214 tilts upwardly at the hooked end 286 and moves across the interface 107 where the hooked end 286 drops to engage a perforation 112 in a component strip 102. With the same motion of the drive shaft 222, hold down arms 288 are elevated and advanced toward the interface 107. When the drive shaft 222 returns leftward, a single component 30 still attached by its leads 34 to the component strip 102, is drawn by the pulling finger 214 engaging the perforation 112, across the interface 107 into the shuttle 202. The component strip 102 is not severed; thus all components 30 on the selected strip 102, even those components 30 on the reel 104, advance toward the interface 107. When the component 30 is properly positioned on the rest 550, the hold down arms 288 drop so that the pointed ends 290 press upon the backing strip 108 and front sheet 110 of the component strip 102 and the vertical and lateral position of the component 30 is retained as required for subsequent operations.

The initial return stroke of the pulling finger 214 always centers on the interface 107, the perforation 112 between the lead component 30, now in the shuttle 202, and the next adjacent component 30, still in the chute 106. Accordingly, one inch forward and return strokes of the finger 214 are programmed by the controller 23 when a component is selected from a component strip 102 having a one inch pitch distance 114 between components 30. One-half inch forward and return strokes are programmed with component strips 102 having a one-half inch pitch distance 114.

Figure 13A:
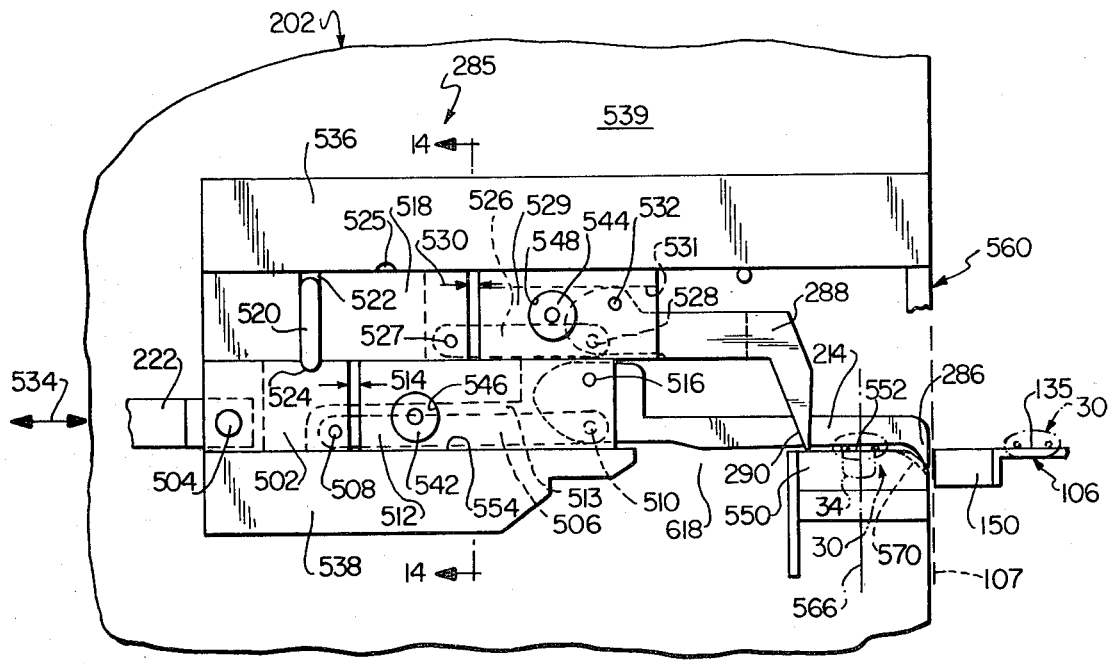
FIGS. 13a–13e show the sequence of operations of the drive assembly and cooperating linkage.
Figure 14:
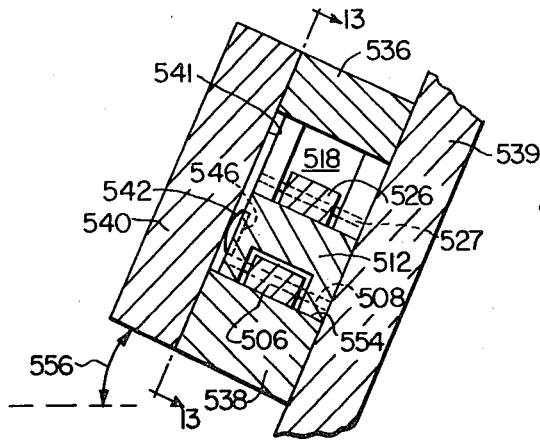

The linkage mechanism 285 which gives motion to the pulling finger 214 and hold down arms 288 is shown in FIGS. 13–15. The drive shaft 222 connects to the pulling finger 214 via a first link 502 and pin 504 connected to the shaft 222, a second link 506 and two end pins 508,510. A first sliding link 512 has a slot 513 in which the second link 506 is slidingly received such that sliding link 512 can translate relative to said second link 506 albeit by only a small distance as indicated by the gap 514 between links 502,512. The first sliding link 512 is pivotably pinned to the pulling finger 214 by the pivot pin 516. It will be appreciated that when the sliding link 512 is translated leftward relative to the connecting link 506 such that the gap 514 is closed, the pulling finger 214 will pivot about the lower pin 510 causing the hooked end 286 of the finger 214 to be elevated as seen in FIG. 13(b).

Figure 13B:
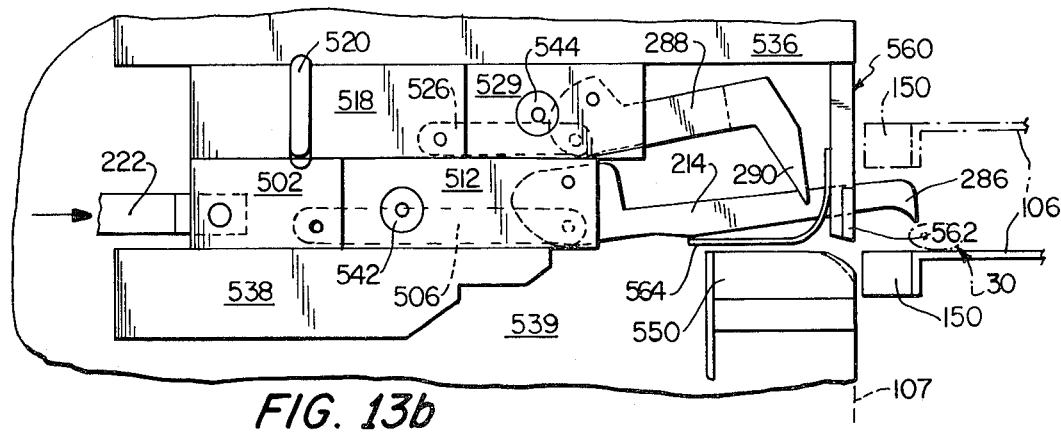

First upper link 518 rests slidingly atop the lower links 502, 512 and bridges the gap 514. A flat key 520 sliding in a slot 522 in upper link 518 disengageably engages a semi-circular notch 524 in the lower link 502. First upper link 518 connects to the hold down arms 288 via the second upper link 526 and end pins 527,528, and a second sliding link 529 has a slot 531 in which the second upper link 526 is slidingly received such that sliding link 529 can translate relative to said second upper link 526 albeit by only a small distance as indicated by the gap 530 between links 518,529. The second sliding link 529 is pivotably pinned to the hold down arms 288 by the pivot pin 532. When the sliding link 529 is translated leftward relative to the second connecting link 526 such that the gap 530 is closed, the hold down arms 288 will pivot about the lower pin 528 causing the pointed ends 290 to be elevated as seen in FIG. 13(b).

All links in the linkage mechanism 285 reciprocally translate horizontally as indicated by the arrow 534. Vertical motion (FIG. 13) of the links is prevented by the upper fixed frame member 536 and lower fixed frame member 538 between which the links translate. The upper and lower frame members 536, 538 connect rigidly to the shuttle mounting plate 539. The links are constrained from motion perpendicular to the plane of the paper of FIG. 13 by a flat cover plate 540 (FIG. 14). The links 502, 512, 518, 529 are dimensioned to move freely toward and away from the interface 107 sliding smoothly on the adjacent surfaces of the back mounting plate 539 and cover plate 540. However, spring washers 542, 544 seated in recesses 546, 548 in the first and second sliding links 512, 529 respectively protrude somewhat above the flat surfaces of the links 512, 529 and rub and drag somewhat against the inside surface 541 of the flat cover plate 540 when the drive shaft 222 actuates to translate the linkage mechanism 285. As a result of this drag of washers 542, 544 on the cover plate 540, when the shaft 222 drives toward the interface 107, the first sliding link 512 slides back relative to link 506 thereby closing the gap 514 and pulling on pivot pin 516. Accordingly the pulling finger 214 elevates, pivoting about the end pin 510 as it moves across the interface 107 in response to the action of the drive shaft 222 (FIG. 13b, c).

Simultaneously, because of engagement of links 502, 518 by the key 520, the second sliding link 529 slides back relative to upper link 526 thereby closing the gap 530 and pulling on the pivot pin 532. Accordingly the hold down arms 288 elevate, pivoting about the pin 528, when the pulling finger 214 advances in an elevated condition toward the interface 107 (FIG. 13b,c).

When the drive shaft 222 is actuated to commence withdrawal of the pulling finger 214 back into the shuttle 202, rubbing of the spring washers 542, 544 on the cover plate 540 causes motion of the sliding links 512, 529 to be delayed momentarily. This reopens the gaps 514, 530 and pushes on the pivot pins 516, 532 in the direction of the interface 107. Accordingly the pulling finger 214 and the hold down arms 288 are lowered (FIG. 13a).

A rest 550, attached to the shuttle mounting plate 539, has an upper surface 552 which is coplanar with the upper surface 554 of the lower frame member 538. These surfaces 552, 554 slope at the same angle 556 (FIGS. 7, 15) to the horizontal as do the upper chute surfaces 135. When the hold down arms 288 are in the lowered position (FIG. 13a), the pointed ends 290 press against the upper rest surface 552.

A cutter 560, having a hardened insert 562, e.g. tungsten carbide, depends from the upper frame member 536 and has its cutting surface aligned to the interface 107. When the shuttle 202 moves vertically downward in response to rotation of the lead screw 206, the cutter 560 on the shuttle 202 moves past the cutter block 150 on the component feed chute 106 and shears the backing strips 108, 110 which have been joining, to this time, a component 30 in the shuttle 202 with the remainder of stored components 30 on a reel 104 in the storage unit 100, all as explained more fully hereinafter.

As best seen in FIG. 15 the cutter 560 and insert 562 have a keyway 568 through which the pulling finger 214 entends without interference. The rest 550 has a downsloping rounded groove 570 which cradles the hooked end 286 of the pulling finger 214 when the finger 214 is in its withdrawn condition (FIG. 13a). The groove 570 assures that the finger 214 presses down on the component leads 34 supported by the rest 550.

The sequence in operation of the drive assembly 220 and the cooperating linkage mechanism 285 follows with special reference to FIGS. 12-15. For an example, a component strip 102 is assumed having components 30 spaced nominally one inch apart, that is the pitch distance 114 between perforations 112 is one inch. The backing strip 108, 110 has a half-perforation aligned to the interface 107 as indicated in FIG. 8 with broken lines.

When the controller 23 commands that a particular component 30 be selected from storage 100, the shuttle 202 is translated to a position adjacent the feed chute 106 containing a strip 102 of those selected components 30. The shuttle 202 stops with the upper surfaces 552, 554 of the lower frame member 538 and rest 550 aligned to the upper surface 135 of the selected chute 106 (FIG. 13). It will be apparent that during translation of the shuttle 202, the pulling finger 214 is withdrawn in the shuttle 202 as seen in FIG. 13a and the drive assembly 220 is in the condition shown in FIG. 12.

Then pressurized gas from a gas source (not shown) is admitted via nipple fitting 274 and passageway 279 into the right chamber 228 (FIG. 12) driving the drive piston 252 and drive shaft 222 to the right until the piston 252 abuts against the right cylinder stop 234. The length 280 of piston travel is one inch. Gas in the chamber 228 to the right of the piston 252 is exhausted via the fitting 270 as the piston 252 travels. During the course of rightward travel of the drive shaft 222 the following motions occur in the linkage mechanism 285. Simultaneously with the first movement of the drive shaft 222, the interconnected first link 502, second link 506 and pulling finger 214 move to the right (FIG. 13). The sliding link 512 lags slightly behind in its motion because of friction of the spring washer 542 against the cover plate 540. Thus the gap 514 closes and the pulling finger 214 pivots upward about the end pin 510 as it moves to the right.

When the first link 502 moves rightward as stated above, the upper link 518 simultaneously moves rightward because of engagement of the flat key 520 in the semi-circular notch 524. The upper connecting link 526 and hold down arms 288 move rightward, and friction of the upper spring washer 544 against the cover plate 540 causes the gap 530 to be closed. Thereby the hold down arms are elevated from the rest 550 as they move rightward.

Figure 13C:
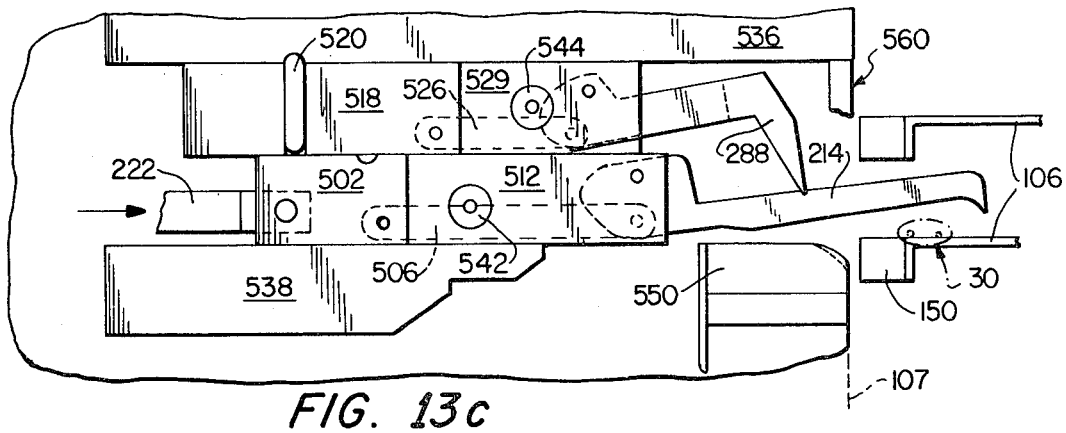

When the key 520 is adjacent the semi-circular notch 525 in the upper frame member 536, the key 520 slides upward disengaging from the lower link 502 (FIG. ). Accordingly, the elevated hold down arms 288 advance substantially to, but stop before, the interface 107, while the elevated pulling finger 214 continues until it has travelled laterally a distance of one inch into the adjacent space between two chutes 106 (FIG. 13c).

Figure 13D:
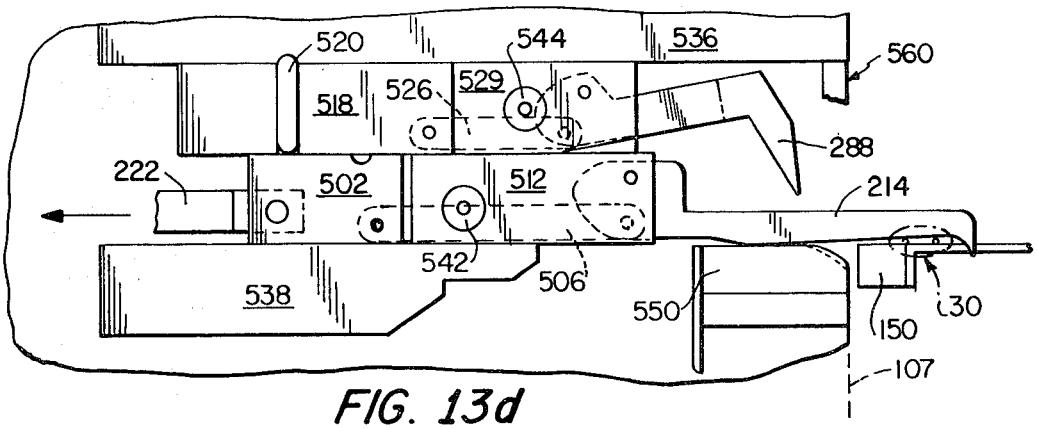

The gas pressure applied via nipple fitting 274 is released and gas pressure is applied to the opposite face of the piston 252 via the nipple fitting 270 and passage 272. Simultaneously pressurized gas is admitted to left chamber 224 via the nipple fitting 276 holding the left piston 262 against the stop 240. With the first increments of return motion of the drive shaft 222, the pulling finger 214 moves leftward, but the spring washer 542 rubbing on the cover plate 540 translates rightward relative to the the lower link 506, reopening the gap 514 and causing the pulling finger 214 to drop (FIG. 13d). The elevated hold down arms 288 remain up, fixed from lateral movement by the key 520 engaging the frame member 536, as hooked end 286 of the pulling finger 214 drops to enter the full perforation 112 in the component strip 102. The continuing return motion of the finger 214 drags the first component 30 adjacent the interface 107 across the interface 107 into the shuttle 202, and advances the entire component strip 102 from the reel 104. The backing strip 108 slides on the top surface 552 of the rest 550 and the leaf spring 564 (FIG. 13b) attached to the cutter 560 presses down on the component leads 34. The component body 32 unsupported in the shuttle 202, is cantilevered on its own leads 34, extending out of the plane of the paper of FIGS. 9 and 13; see also FIG. 15.

Figure 13E:
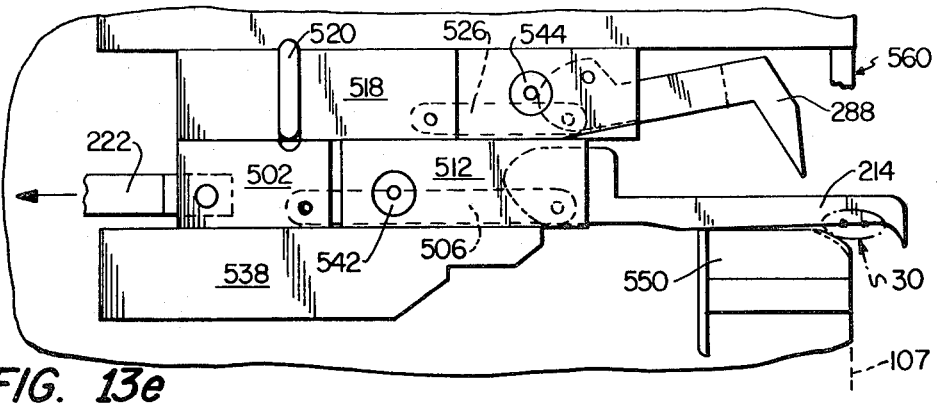

As the drive shaft 222 is withdrawn past the position shown in FIG. 13e, the key 520 drops into engagement with the lower link 502 causing the hold down arms 288 to move with the pulling finger 214. With the first return motion of the hold down arms 288, friction of the spring washer 544 on the cover plate 540 reopens the gap 530 causing the arms 288 to drop onto the backing strip 108, 110. The pointed ends 290 dig into the backing strip 108, 110 and press it against the rest 550. Both the pulling finger 214 and arms 288 hold down and drag the component strip 102 into the shuttle 202 as the piston 252 travels until it stops against the end 258 of the center shaft 254. Now the first full perforation 112 on the component strip 102 is centered on the interface 107 (FIG. 13a) and the component leads 34 are in a preferred position, substantially centered on the rest 550 relative to the rest centerline 566. Under direction of the controller 23, the motor 210 is actuated to drive the shuttle 202 downward a short distance, i.e. approximately 0.18 inch, causing the cutter 560 to pass across the edge of the cutter block 150 and shear the backing strip 108 and front sheet 110. The selected component 30 is now held to the rest 550 solely by the arms 288 and finger 214 and is completely separated from the component strip 102 in the storage chute 106 and reel 104. The component strip 102 has been severed at the center of the perforation 112 and advanced by the pulling finger 214 so that the condition at the end of the selected chute 106 is physically restored, i.e. one-half of a perforation 112 is at the interface 107, enabling a repetition of the cycle, if the controller 23 so directs, for withdrawing another component 30 from the same chute 106. The shuttle 202 holding the selected component 30 is then translated downward along the guide rails 204 to the component insertion head assembly 300 by operation of the motor 210 to rotate the precision lead screw 206.

Operation of the shuttle 202 differs somewhat to select a component 30 stored on a component strip 102 using one-half inch pitch distance 114 between components 30. As in the example above, the component backing strip 108, 110 has a half perforation aligned to the interface 107. The linkage mechanism 285 is in the condition illustrated in FIG. 13 excepting that no component 30 is yet present on the rest 550. The controller 23 directs the shuttle 202 to stop at the position adjacent the chute 106 holding the desired component 30. Then pressurized gas from a gas source (not shown) is admitted via the nipple fitting 275 and passageway 277 into the central chamber 226 (FIG. 12) driving the center piston 256 rightward until it contacts the middle stop 236; the distance 282 of travel is one-half inch. The motion of the piston 256 is transmitted directly to the drive shaft 222 via the center shaft 254 pushing against the drive piston 252. As the drive shaft 222 moves toward the interface, 107, the pulling finger 214 and the hold down arms 288 are elevated because of rubbing contact between the spring washers 542, 544 against the cover plate 540, as described above. The pulling finger 214 extends into the opening between adjacent chutes 106.

Gas pressure is released from the fitting 275 and applied simultaneously to the right chamber 228 via the fitting 270 and passageway 272, and to the left chamber 224. This forces the drive shaft 222 to return to the position shown in FIG. 12. By this return translation of the drive shaft 222, the pulling finger 214 is lowered to engage a perforation 112 in the component strip 102 and draw a component 30 across the interface 107 into the shuttle 202. The action of the hold down arms 288 in descending to clamp the backing strip 108, 110 to the rest 550 and to assist in drawing the component 30 into the shuttle 202 is as described above. Then the shuttle 202 is moved downward a short distance on command from the controller 23, causing the cutter 560 to move past the stationary cutter block 150 on the chute 106. The component backing strip 108, 110 is sheared, at the center of the perforation 112 thereby separating the component 30 in the shuttle 202 from the remainder of the component strip 102 in the storage unit 100.

Then an adjustment step is performed for the component 30 having a pitch distance 114 of one-half inch. Pressure in the left chamber 224 is released and the continuing pressure in the right chamber 228 drives the piston 252 until it rests against the central stop 236. In this translational process, the pulling finger 214 and arms 188 acting on the component strip backings 108, 110 pull the component 30 across the upper surface 552 of the rest 550 by a distance 284 of one-quarter inch so that the component leads 34 symetrically straddle the centerline 566 of the rest 550. Accordingly whether the component 30 is stored with a pitch distance 114 of one-half inch or one inch, the selected component 30 after separation from the remaining component strip 102 of stored components 30, is positioned on the rest 550 with its leads symmetrically straddling the rest centerline 566. Thus later operations performed by the insertion head 302 on all selected components 30 are the same.

The shuttle 202 includes a component detector assembly 572 mounted adjacent to the linkage mechanism 285 (FIGS. 10, 16). The detector assembly 572 is comprised of a drive cylinder 574, fixedly attached to the shuttle 202 by the bracket 576 and bolts 578. The drive cylinder 574 is pivotably connected to the bracket 576 by the pin 580. The piston shaft 582 connects pivotably, via a clevis rod 584 and pin 585, to the switch plate 586 which in turn is pivotably mounted to the shuttle 202 via the pivot pin 588. Accordingly, the pivot pin 588 and bracket 576 have a fixed physical relationship. A nipple fitting 590 connects to the internal chamber of the drive cylinder 574 and, when pressurized, extends the piston shaft 582. A pin 592 engages the end of the shaft 582 where it connects with the clevis rod 584; and a tension spring 594 is elastically stretched between the pin 592 and nipple fitting 590 so that the shaft 582 is withdrawn into the drive cylinder 574 when the cylinder 574 is not pressurized.

A switch 596, having an extended leaf 598 for actuation of said switch 596, is fixedly mounted to the switch plate 586. The leaf 598 is engaged by the detector 600 at one end 602. The detector 600 is pivotably connected between its ends to the switch plate 586 by a shoulder screw 604. The other end 606 of the detector 600 is elongated, tapered upward at the tip 607, and extends away from the pivot screw 604 in the direction opposite from the switch 596. When the drive cylinder 574 is pressurized, the lower edge 608 of the detector 600 lies parallel to the plane of the upper surface 552 of the rest 550 and alongside the rest 550 (FIGS. 10, 13). The detector end 602 is normally pressed upward against the switch leaf 598 by the compression spring 610 engaged between the switch plate 586 and a pin 612 extended through the end 602 of the detector 600. The edge 614 of a boss 616 raised from the surface of the switch plate 586 limits the upward motion of the detector 600 against the leaf 598. When a component 30 is drawn by the pulling finger 214 and hold down arms 288 onto the rest 550 the component leads 34 (not the component body 32) slide under the tapered tip 607 and lower edge 608 of the detector 600. The presence of the leads causes the detector 600 to pivot to the position indicated as 600' about the shoulder screw 604, thereby lowering the other end 602 by further compression of the spring 610. Lowering of the detector end 602 allows the leaf 598 to lower and actuate the switch 596, whereby a signal is fed to the controller 23 indicating that a component 30 was present on the component strip 102 and said component has in fact been drawn into the shuttle 202. Occurrence of this signal allows the controller 23 to proceed with the normal operation of the shuttle 202 as described above. Non-occurrence of this signal indicates that no component 30 was present on the component strip 102 at the interface 107. In this case the controller 23 drives the shuttle 202 down slightly, e.g., in the order of 0.18 inch, to cut the paper backing strips 108, 110; then the shuttle is raised to its prior position and the linkage mechanism 285 is directed by the controller 23 to repeat the steps required to select and detect a component 30 from that same feed chute 106. If there should be three consecutive unsuccessful attempts to select a component 30 as indicated by the detector assembly 572, the controller 23 will stop the machine 10 and actuate a signal, e.g., audible or visible, (not shown) indicating the nature of the malfunction.

It should be noted that in successive operations where no component 30 is present, the small segment of paper carrier strip 108, 110 remaining on the rest 550 after each unsuccessful sequence is pushed by the next segment and an intermittent gas jet (not shown) into the space 618 between the rest 550 and lower frame member 538. The gas jet (not shown) and gravity cause the paper segment 108, 110 to fall into a collection bin (not shown) for disposal.

When the shuttle 202, carrying a selected component 30, translates downward to the pick-up area, the pressure on the detector drive cylinder 574 is released. The spring 594 then causes the shaft 582 to retract thereby pivoting the switch plate 586 about pivot pin 588 and moving the detector 600 upward and away from the component leads 34. This provides access to the leads 34 for the insertion head 302 as explained hereinafter.

CUT AND CLINCH 400

As seen in FIG. 1, the cut and clinch mechanism 400 is fixed to the horizontal platform 12 and is located below the X-Y platform 22 and printed circuit board 20 which is to receive a component 30 from the insertion head 302. As the insertion head 302 descends to insert the component leads 34 into predrilled holes in the circuit board 20, the cut and clinch mechanism 400 rises vertically beneath the board 20 and receives the leads 34 as they extend beyond the lower board surface. When the component 30 is fully inserted, the cut and clinch mechanism 400 is actuated by the controller 23 to cut the leads 34 and clinch them against the underside of the circuit board 20. The cut and clinch mechanism 400 is then lowered.

The cut and clinch mechanism 400 is mounted for rotation about a vertical axis 402 which is colinear with the vertical axis of the insertion head 302 so that when a component 30 is angularly reoriented by the insertion head 302 prior to insertion the cut and clinch mechanism 400 is rotated an equal angular distance to remain aligned with the component leads 34.

The cut and clinch mechanism can be of any known type which cuts and clinches a plurality of leads simultaneously. FIG. 1 generally indicates a mechanism 400 including two identical devices, opposedly mounted so that each device cuts one lead 34. Such opposed devices are disclosed, for example, in pending application, Ser. No. 875,855, filed Feb. 7, 1978 now U.S. Pat. No. 4,151,637. Another device, e.g., Ser. No. 773,347 filed Mar. 1, 1977, now abandoned, can also be used to cut and clinch both component leads 34 simultaneously. A single lead cutter (not shown) is also suitable but less desirable, requiring two operational steps and increased time for performance. The cut and clinch mechanism 400 is not a novel part of the insertion machine 10 of this invention and accordingly is not described in any greater detail herein. Suffice to say here that the controller 23 or an interconnected mechanical drive mechanism (not shown) coordinates the operations of the insertion and cut and clinch mechanisms as required.

COMPONENT RELEASE DEVICE

The vertical shuttle 202 also includes a component release device 640 (FIG. 15) which operates in cooperation with the insertion head 302 to separate the selected component 30, carried by the shuttle 202 on the rest 550, from its paper carrier strips 108, 110. In a single action, of the component release device 640, as described hereinafter, the component leads 34 are severed and the shortened leads 34, attached to the component body 32 are gripped by the insertion head 302.

As seen in FIG. 15, the component release device 640 mounts generally above the rest 550 and includes a double acting piston 642 sliding within a circular cylinder 644 shown partially in cross-section in FIG. 15. The O-ring 646 seals the forward side of the piston 642 from the rear side. The forward nipple fitting 648 allows for the input and release of gas to the forward side of the piston 642 while the back nipple fitting 650 serves for the input and release of gas to the back side of the piston 642. The cylinder 644 is rigidly mounted to the shuttle 202 by means of a first pivot pin 652 and mounting tab 654.

Figure 17B:
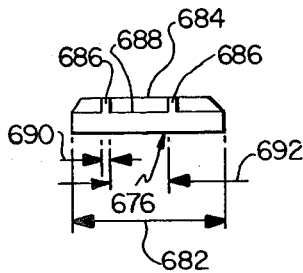

The piston shaft 656 extends from the forward end of the cylinder 644 and is slidingly connected by a common pivot pin 658 to two arms 660, 662. The common pivot pin 658 rides between the sides of the U-shaped notch 664 located at the external end of the drive shaft 656. The arm 662 is pivotably mounted to the shuttle 202 by means of the pin 666 and retaining clip 668. The arm 660 is pivotably linked by the pin 670 and retaining clip 672 to the cutter arm 674 which in turn is pivotably connected to the shuttle 202 by the pin 675. An elongated cutter 676 is fixedly attached near the far end 678 of the cutter arm 674, and extends generally parallel to the linkage mechanism 285. The lower end 680 of the cutter 676 is offset from the rest 550, but its width 682 (FIG. 17) spans the leads 34 of the component 30 which is centered upon the rest 550 after being selected from the storage unit 100 as previously described. The cutter 676 is generally rectangular but tapers from its outer surface 684 toward the blunt transverse end 680. A pair of rectangular ridges 686 are elevated above the tapered surface 688, the upper surfaces of these ridges 686 being coplanar extensions of the cutter outer surface 684. The width 690 of the ridges 686 is in the order of the diameter of the component leads 34, and the spacing 692 between the ridges 686 corresponds to the spacing 116 between the component leads 34. The edge 694 of the cutter 676 is sharp. When a component 30 is centered on the rest 550, the cutter ridges 686 align to the component leads 34.

When pressurized gas from a gas source (not shown) is applied to the cylinder 644 via the back nipple fitting 650, (FIG. 15) the piston 642 moves upward and leftward actuating the arms 660, 662, 674 and causing the cutter 676 to move downward past the sharp edge 696 of the rest 550 whereby in a subsequent operation the component leads 34 are sheared at the interface between the cutter edge 694 (FIG. 17) and the rest edge 696. It should be noted that the paper backing strips 108, 110 are positioned entirely on the rest 550 and are not acted upon by the cutter 676. Thus as explained more fully hereinafter, the cutter action leaves the component 30 free of its carrier strip 108, 110. Release of the gas pressure at the fitting 650 and application of gas pressure at the forward nipple fitting 648 returns the piston 642 to the right and raises the cutter 676 again above the rest 550.

INSERTION HEAD ASSEMBLY 300

As shown in FIG. 1, the insertion head assembly 300 mounts to the vertical shuttle assembly 200 and includes the insertion head 302, a drive motor 304 and horizontal drive shaft 306 which connects between the motor 304 and insertion head 302. Operation of the motor 304 is used to pivot the insertion head 302 about the horizontal shaft axis 308 from a vertical position (FIG. 18) to a tilted position 302' indicated by broken lines in FIG. 18. The horizontal axis 308 is parallel with the x axis of the x-y positioning platform assembly 16, and the insertion head 302, when pivoting, moves generally in a plane parallel to the y axis of the positioning platform assembly 16.

As most clearly shown in FIGS. 19, 20 the insertion head 302 is comprised of rectangular housing 310 having a circular piston 312, sliding within a cylindrical casing 314 and sealed thereto by the O ring 316. Travel of the piston 312 is limited in one direction by the bumper 318 and the rear cover 320 which is fastened to the housing 310 by a plurality of bolts 322, and in the other direction by the partition 324. The partition 324 is fixed in the housing 310, being restrained against the housing shoulder 326 and the extended end 328 of the casing 314. The circular shaft 330 of the piston 312 extends through the partition 324 and is slidingly sealed thereto by the O ring 332. A second piston 334 slides on the shaft 330 but is constrained between the partition 324 and the offset 336 in the casing 314. Additional O rings 338 seal against outleakage of gas from the cylinder chamber 340.

An extended transverse pin 342 passes through the left end (FIG. 19) of the piston shaft 330 and is fixedly connected thereto by another transverse pin 344. The elongate pin 342 at its upper end engages a hole 346 in the generally cylindrical connector member 348 which fits slidingly within the housing 310. It should be noted that when pressurized gas is admitted to the right side (FIG. 19) of the piston 312 via the inlet opening 350, the piston 312 translates leftward and the elongated pin 342 attached to the shaft 330 causes the connector member 348 and all elements to the left of the connector 348 to similarly translate leftwardly within the housing 310 as described hereinafter.

The piston 312 travels leftward until it stops against the second piston 334 which in turn rests against the fixed partition 324. When pressurized gas is admitted via a passageway (not shown) between the partition 324 and the second piston 334, and pressure is released at the rear inlet opening 350, the piston 312 translates rightward by a short distance 339, e.g., 0.25 inch. The headpiece 390 which advances and returns with the motion of the piston 312, correspondingly withdraws by the same distance 339. When pressurized gas is then admitted between the two pistons 312, 334 via a passageway (not shown), the piston 312 (and the gripper jaws, described below) translates to rest against the bumper 318. The bumper 319 keeps the pistons 312, 334 from direct contact.

The left end of the piston shaft 330 is supported by the sleeve 352 within the connector 348 to assure concentricity of the piston shaft 330 with the longitudinal axis 354 of the casing 314 and housing 310. The connector member 348 has a circular opening 356 in its base and a bearing 358 and sleeve 360 within.

A vaned shaft 362 is supported at one end 364 in the bearing 358 and sleeve 360 and concentrically with the axis 354. The other end 366 of the vane shaft 362 is supported in the collar 368 and sealed thereto against gas leakage by a pair of spaced apart O rings 370.

As most clearly illustrated in FIGS. 20, 21, a pair of radial vanes 372 extend from the vane shaft 362. The vane tips 374 are relieved by a rectangular notch 380 recessed in the outer periphery of each vane 372. U-shaped elements 381, e.g., fabricated of rubber, are cradled in the notches 380 with their end surfaces 382 extended to slidingly seal with the cylinder 378. The vanes 372 are enclosed with sliding contact in the cylinder 378 and confined at their lateral edges 383 by end caps 384 which are slidingly sealed to the hub 376 of the vanes 372 by O rings 386. A spacer 388 separates the collar 368 from the end cap 384.

The left end 366 of the vane shaft 362 extends into the insertion head 390 and provides the back end stop of the internal cylinder chamber 392. The pin 394 connects the vane shaft 362 to the insertion head 390 such that when the vane shaft 362 is rotated about the longitudinal axis 354, the insertion head 390 and attached elements rotate with the vane shaft. The collar 368 and connector member 348 do not rotate, one interface between rotationally static and dynamic elements being designated in FIG. 19 by the reference number 396. The right end 364 of the vane shaft 362 is connected to the sleeve 360 by the pin 398 causing the sleeve 360 and vanes 372 to rotate simultaneously. Rotation of the vanes 372 is limited by the two blocks 412 located within the cylinder 378 (FIGS. 20, 22) and rigidly attached at both ends by screws 414 to the end caps 384. A sealing element 416, e.g. rubber, encircles each block 412, being recessed in the groove 418 in the block 412, and provides a static seal with the cylinder 378 and a sliding seal against the hub 376 of the vane shaft 362. Pressurized gas admitted within the cylinder 378 via the manifold block 420, nipple fitting 422 passageway 423 and the passageway 424 in the block 412, rotate the vane shaft 362 (with the insertion head 390) to the position shown in FIG. 20. Pressurized gas admitted within the cylinder 378 via the manifold block 420, nipple fitting 425, passageway 426 and the passageway 427 in the block 412, when the other fitting 422 is unpressurized, rotate the vane shaft 362 clockwise (FIG. 20) until the vane surfaces referenced by the number 428 rest against the block surfaces referenced by the number 429. Accordingly, the insertion headpiece 390 can be rotated by actuation of the vaned shaft 362 by ninety degrees upon command of the controller 23, whereby radial lead components 30 are inserted into a printed circuit board 20 with the component leads 34 being parallel, as required, to either the x or y axis of the platform 22.

It should be apparent that in an alternative embodiment, any angle of orientation may be achieved using, for example, an appropriate sensor, encoder and feedback loop.

The insertion headpiece 390 includes a cylindrical chamber 392 at the end abutting the rotational interface 396. At the other end the headpiece 390 has a wide vertical central slot 430 (FIG. 23) in which the gripper 432 is pivotably mounted by the transverse pin 434 which fixedly engages the headpiece 390.

A wedge 433 is pivotably mounted in the wide vertical central slot 430 in the headpiece 390 by another transverse pin 435, and a pair of opposed rocker arm 437 are symetrically and pivotably mounted to the front face 439 of the headpiece 390 by the longitudinally oriented shoulder screws 441. As shown in FIG. 23, the wedge 433 has a cam surface 443 which acts against the inside surfaces 447 of the opposed rocker arms 437 when the wedge 433 is pivoted, forward end 449 down. Such downward, or closed, pivoting of the wedge 433 causes the lower rocker arm ends 451 to pivot inwardly on the shoulder screws 441 to clamp the gripper 432 therebetween. A plunger piston 436 fits slidingly (FIG. 19) within the chamber 392 being sealed thereto by an O ring 438. A hollow shaft 440 extends from the plunger piston 436 and extends into the slot 430 of the headpiece 390 being slidingly sealed to the headpiece 390 by an O ring 442. An elongated pusher rod 444 fits within the hollow piston shaft 440 and is slidingly sealed thereto by an O ring 445. A pin 446 fixed to the headpiece 390 rides in the short slot 448 in the hollow shaft 440 and extends into the elongated keyway slot 459 in the pusher rod 444. These slots 448, 459 and the pin 446 limit the travel of the hollow shaft 440 and prevent rotation about the longitudinal axis 354 of the shaft 440 and pusher rod 444.

To advance or extend the piston shaft 440 and pusher rod 444 leftward relative to the headpiece 390 (FIG. 24), gas pressure is applied to one face 450 of the piston 436 via the channel 452 in the vane shaft 362 and the groove 453 in the collar 268. To return the piston shaft 440 and pusher rod 444 rightward relative to the headpiece 390, gas pressure is applied to the other face 454 of the piston 436 via the channel 455 in the headpiece 390 and groove 456 in the collar 368. The conventional nipple fittings and passages through the housing 310 which admit pressurized gas into the grooves 453, 456 in the collar 368 have been omitted from FIG. 19 for the sake of clarity in illustration.

As the plunger piston 436 and shaft 440 advance, the shaft shoulder 467 first strikes the inclined cam surface 461 on the wedge 433 and then the shaft end 458 strikes the inclined cam surface 463 on the gripper 432. The wedge 433 and gripper 432 unable heretofor to pivot about their mounting pins 434, 435 because of contact of the gripper end 460 and wedge end 465 against the shaft 440, now pivot the jaws 462 and lower ends 451 of the rocker arms 437 away from the housing axis 354 as the gripper end 460 and wedge end 465 sink into the chordal flats 464 in the shaft 440. The displaced positions of the gripper 432 and wedge 433 are indicated and given primed reference numbers 432' and 433', in FIG. 25. Numbers with a prime marking (') also identify the advanced positions of the shaft 440' and pusher rod 444'. When the piston 436 is returned to the right (FIG. 19), the gripper jaws 462' are driven back toward the axis 354 and rocker arms 437 pivot to clamp against the sides of the gripper 432. As explained below, the gripper 432 is released by the rocker arms 437 and is pivoted away from the component 30 as the component leads 34 are inserted in the circuit board 20.

As shown in FIGS. 19, 23, 24, the gripper 432 is comprised of two end leafs 466 and a central element 468 held loosely together by the transverse pins 470. The jaws 462 are formed by an offset 472 on each side of the central element 468 such that a generally rectangular slot 474 is present between each end leaf 466 and the central element 468. The slot width 476 provides for an interference fit for the diameter of a component lead 34 when the gripper 432 is clamped by the rocker arms 437. Otherwise the leads 34 fit loosely within the slots 474 when the wedge 433 is in the open or release condition.

When the jaws 462 are adjacent to the leads 34 of a component 30 resting on the rest 550 of the shuttle 202 (FIG. 24), descent of the cutter 676 by action of the piston 642 in the component release device 640 shears the component leads 34 from the backing strips 108, 110 by passing the cutter edge 694 across the edge 696 of the rest 550. Simultaneously the cutter ridges 686 (FIG. 17) press the leads 34 into the slots 474 of the gripper jaws 462 and ret in them therein. Because the rocker arms 437 are not clamping the gripper 432 at that moment, the leads 34 easily enter the slots 474. Beveled edges 478 guide the component leads 34 into the slots 474 and negate the effect of any lead misalignment which may exist. When the wedge 433 is pivoted to its closed or clamping position, forward end 449 down toward the axis 354, the rocker arms 437 clamp the jaws 462 together to tightly grip the leads 34. The width of the ridges 686 on the cutter 676 is less than the diameter of the leads 34 and less than the minimum compressed width 476 of the jaw slots 474. Thus the cutter ridges 686 are not gripped by the jaws 462 and are freely withdrawn by action of the piston 642.

Thus radial lead components 30 are grasped by their leads 34 by a single gripper 432 and are ready for insertion into a circuit board 20. Because the component body 32 is not acted upon, many shapes of components 30 may be inserted without any variation in the gripper 432. As seen in FIG. 24 the recess space indicated by the reference number 480 accommodates the component body 32 when it is held by the jaws 462.

It is especially noteworthy that the jaws are one-sided; that is, unilaterally positioned side by side, and each jaw holds one component lead. Thus, conventionally opposed, alligator type jaws are not used. Accordingly, the space on the circuit board 20 required by the insertion head 302 for component insertion, i.e., the insertion heads 'footprint', is reduced and the density of components 30 on the circuit board 20 may be increased.

SEQUENCE OF OPERATION

The sequence of operations of the radial lead component insertion machine 10 of this invention follows. Many of the details, already presented above, of operation are omitted here for the sake of brevity.

A radial leaded component 30, which is stored (FIG. 1) on a reel 104 in the storage unit 100, is required for insertion in the printed circuit board 20 mounted on the x-y positioning platform 16.

The controller 23, whether following a stored program or manually directed, commands the x-y platform 22 to translate in the x and y directions to center the predrilled holes, which are to receive the selected component 30 in the circuit board 20, about the vertical axis 402. The controller 23, substantially concurrent with the positioning of the x-y platform 22, directs the shuttle 202 (FIG. 10) to travel vertically upward from the pick-up area adjacent the circuit board 20, to a horizontal component feed chute 106, which contains a component strip 102 of the components 30 of the desired value and type. The shuttle 202 stops its vertical movement with the upper surface 552 of the shuttle rest 550 being coplanar with the upper surface 135 of the chute 106.

The controller 23 then causes the drive assembly 220 (FIG. 12) to actuate the linkage mechanism 285 (FIG.

13). As the drive shaft 222 of the drive assembly 220 advances toward the interface 107, located between the storage unit 100 and the vertical shuttle assembly 200, the pulling finger 214 and hold down arms 288 of the linkage mechanism 285 are elevated. The pulling finger 214 moves laterally across the interface 107, extending into the chute 106 and then is lowered to engage the hooked end 286 of the finger 214 in the first full perforation 112 in the component strip 102. The pulling finger 214 is then withdrawn into the shuttle 202, pulling the entire component strip 102 by a distance equal to the pitch distance 114 of components 30 on the component strip 102. In the pulling process the first component 30 on the component strip 102 adjacent the interface 107 is drawn into the shuttle 202 and the hold down arms 288 in the shuttle 202 descend to press with their pointed ends 290 on the paper backing strips 108, 110 of the component strip 102. The hold down arms 288, once descended, move with the pulling finger 214 and aid in translating the component 30 fully into the shuttle 202. At the end of the pulling finger's return stroke, the selected component 30 rests upon the shuttle rest 550 with the backing strip 108 pressed by the hold down arms 288 against the upper rest surface 552. The spring 564 attached to the cutter 560 also holds the backing strip 108, 110. The perforation 112 engaged by the hooked end 286 of the pulling finger 214 has been centered over the interface 107 and the selected components' body 32 extends unsupported, but cantilevered on the component leads 34, outward from the rest 550 (FIG. 15).

The shuttle 202 is then moved vertically downward a short distance in the order of 0.125 inch, whereby the cutter 560 with its hardened insert 562 attached to the shuttle 202 and aligned to the interface 107, translates past the hardened cutter block 150 attached to the component chute 106 so as to sever the paper backing strips 108, 110. Thus the selected component 30 is separated from the remainder of the component strip 102 in the storage unit 100 by cutting the strip 102 transversely at the center of the strip perforation 112. In the process all components 30 on the component strip 102 have been advanced by one pitch distance 114 toward the interface 107 and the next component 30 on that same strip 102 is in position for selection and a repetition of the withdrawing process if the controller 23 so directs.

When a component 30 has been drawn into the shuttle 202, the component detector assembly 572 (FIG. 16) with its blade like detector 600 senses the presence or absence of the component leads 34. If a component 30 has been pulled into the shuttle 202, actuation by the component leads 34 of the detector assembly 572, by pivoting the detector 600, enables a normal continuation of the sequence in operation of the machine 10.

On the other hand if a component 30 is missing in the component strip 102, the absence is detected by the failure of the detector 600 to pivot about the shoulder screw 604. The controller 23 then causes the shuttle 202 to move downwardly slightly to shear the paper backing strips 108, 110 as described above, and then the shuttle 202 is raised again to the same feed chute 106 and the sequence to select a component 30 is repeated. If three consecutive unsuccessful attempts are made to select a component 30, the machine 10 shuts down automatically and a signal (not shown) informs the operator of the difficulty. After each unsuccessful attempt, the paper strip segment is removed from the shuttle rest 550 by an air jet (not shown) which drops the paper into the space 618 adjacent the rest 550 for collection in a waste bin (not shown).

After a component 30 has been successfully transferred from storage 100 into the shuttle 202, and has been detected by the detector assembly 572, the paper backing strips 108, 110 are severed transversely as stated above. If the selected component 30 was stored on a strip 102 having a 0.50 inch pitch distance 114, the finger 214 and hold down arms 288 pull the component 30 an additional 0.25 inch into the shuttle 202 after the backing strip 108,110 has been severed. This added translation centers the 0.50 inch pitched component on the rest 550, but is not required to center a component 30 stored with a 1.00 inch pitch. Then as commanded by the controller 23, the shuttle 202 is translated by the motor 210 and precision screw 206 to its lowest position, i.e., the pick up area, on the shuttle assembly 200. During the shuttle travel, gas pressure is released from the drive cylinder 574 of the detector assembly 572, whereby the tension spring 594 contracts causing the switch plate 586 to pivot about the pivot pin 588. This raises the detector blade 600 off the component leads and leaves clear access to the component 30 for the insertion head 302. When the shuttle 202 later travels upward to select the next component 30, the drive cylinder 574 is again pressurized with gas via the nipple fitting 590, causing the detector 600 to be lowered into its component sensing position.

The insertion head 302 is stationed vertically over the printed circuit board 20 following completion of a prior component insertion. The head piece 390 has been withdrawn into the housing 310. The hollow shaft 440 is advanced such that the gripper 432 and wedge 433 are in the open or release condition. Accordingly, the end leafs 466 are riding loosely on the pins 470.

The insertion head 202 is now tilted (FIG. 18) about the horizontal axis 308 upwardly toward the shuttle 202 with the selected component 30. The longitudinal axis 354 of the insertion head 302 is inclined by tilting substantially to the angle 556 of the component rest 550.

Next gas pressure is applied to the back side of the piston 312 in the insertion head 302 via the inlet opening 350 in the housing 310, causing the piston 312 and the entire inner assembly to translate within the housing 310 whereby the headpiece 390 is extended from the housing 310 in its open condition (FIG. 25). At this condition the gripper jaws 462 are adjacent the component leads 34 with each lead 34 being substantially above and parallel to a slot 474 in the jaws 462. The longitudinal axis 354 of the insert head 302 lies substantially in the plane of the component leads 34.

Then the internal chamber 392 of the insertion head 302 is pressurized via the channel 455 and groove 456 causing the hollow shaft 440 to withdraw leftward (FIG. 19) until the piston face 450 contacts the vane shaft 362. In this process the gripper 432 is forced into the closed or clamping position as the gripper end 460 is driven out of the chordal flat 464. As the gripper 432 closes, the component leads 34 slide into the jaw slots 474 or rest on the bevel surfaces 478 (FIG. 24). Then the cutter 676 on the shuttle 202 descends to shear the leads 34 against the shuttle rest 550 externally of the jaws 462, and to push the leads 34 down into the slots 474 with the cutter ridges 686. Substantially simultaneously, the wedge 433 is closed when the wedge end 465 is driven out of the flat 464 in the hollow shaft 440. Closing of the wedge, i.e., wedge end 449 moves toward the axis 354, forces the lower ends 451 of the rocker arms 437 to pivot inward and clamp against the jaw end leafs 466, compressing the component leads 34 tightly in the jaw slots 474.

Then in sequence the insertion headpiece 390 is withdrawn into the housing 310 by application of gas pressure to the left side of the piston 312. The insertion head 302 is then rotated about its transverse axis 308 into a vertical position with the component leads 34 extending vertically downward toward the printed circuit board 20.

The insertion headpiece 390 holding the component 30 then descends by the application of pressurized gas to the back side of the piston 312 via the end inlet 350. This downward motion of the insertion headpiece 390 starts the ends of the leads 34 into the predrilled holes in the circuit board 20. Then gas pressure is applied to the backsides 450, 461 of the piston 436 and pusher rod 444, causing the hollow shaft 440 to advance (left, FIG. 19) causing the wedge 433 to open, pivoting the rocker arms 437, and thereby releasing the lateral holding pressure from the jaws 462. The leads 34 are then free to slide in the jaw slots 474. The far end 482 of the pusher rod 444 extends from the shaft 440 to contact the top of the component 30 and push it fully into the circuit board holes while substantially simultaneously the gripper 432 is forced by the continued advance of the shaft 440, to swing away (open) from the component leads 34 to the position shown as 432' (FIG. 25).

As the jaws 462 start to swing away from the component leads 34, gas pressure is applied to the left side (FIG. 19) of the second piston 334 causing the rear piston 312 to be driven back (right) by the distance 339, e.g., 0.25 inch. Accordingly, the jaws 462 are withdrawn by the distance 339 from the circuit board 20 as they swing away, avoiding contact with components 30 already attached to the circuit board 20.

The pusher rod 444 pushes on the top of the component 30. This action is against the component body 32 for components 30, such as shown in FIGS. 2a–d and on the bent lead 34 for components 30 such as illustrated in FIG. 2e.

As the insertion headpiece 390 descends with the component 30, the cut and clinch mechanism 400 is elevated in the known manner to support the circuit board 20 from beneath and receive the lead ends as they protrude below the board 20. The leads are then cut and clinched against the underside of the circuit board 20 ready for soldering.

When a component 30 is to be inserted with its leads aligned to the Y axis, the insertion headpiece 390, holding the component 30, is rotated ninety degrees before descent by applying gas pressure to the vane shaft 362 via the nipple fitting 425 and passageways 426, 427. The cut and clinch mechanism 400 is simultaneously rotated by ninety degrees to receive the leads 34.

The shuttle 202, still retaining the paper backing 108, 110 and attached lead remnants, is directed vertically upwards by the controller 23 to select the next component 30 from storage 100 immediately after the insertion head 302 moves away from the shuttle with the previous component 30. The scrap materials are pushed from the shuttle rest 550 by the arrival of the next component 30 on the shuttle rest 550 and by a gas jet (not shown).

The operations are repeated under programmed control 23 until the circuit board 20 is populated with the desired assortment of components 30 drawn from the storage unit 100. It should be understood that suitably located sensors and detectors (not shown) verify completion of each operational step, thereby enabling the controller 23 to command performance of the next step. Appropriate alarm signals indicate malfunctions to the operator.

From the preceding description of a preferred embodiment, it is evident that the objects of the invention are attained. Although the invention has been described and illustrated with detail, it is to be understood that the above is by way of illustration and example only and many modifications and alternative embodiments are possible which fall within the scope and spirit of this invention.

For example, in an alternative embodiment, the component strips 102 may be stored folded in an 'ammunition box' arrangement rather than on the reels 104. Also, finite length strips may be used. Further, the storage unit may comprise a mixed arrangement of reels, boxes and strips.

It should also be understood that components having different spacings between the leads can be inserted by means of interchangeable gripper 432 having different element dimensions. For example, a narrower lead spacing is accommodated by having a thinner central element 468 and thicker end leafs 466 (FIG. 23b). The cutter 676 cooperating with the interchangeable gripper 432 has ridges 686 (FIG. 17) spaced apart to enter the jaw slots 474. It should be understood that the beveled edges 478 allow for gripping of many components of varying lead spacing without the need to interchange the jaw elements and cutter.

Also, in another alternative embodiment of this invention, components having three radial leads, e.g., transistors, are inserted. For this alternative embodiment, the gripper 432 is comprised of four elements held in alignment by the pins 470. As seen in FIG. 26, the jaws 462 are comprised of the end leafs 466 and two adjacent central elements 469, 471. Offset sides and beveled edges of the central elements 469, 471 and end leafs 466 cooperate to produce the two slots 474, described above, and a third central slot 475. The cutter 676 used with this alternative embodiment includes three ridges 686 to drive the component leads 34 into the slots 474, 475. Operation of the gripper 432 in grasping components 30 held on the shuttle 202 is the same as described above for the two-leaded components. Obviously, the gripper and cutter can be constructed to hold components having many different lead spacings, symmetrical and asymmetrical, and number.

We claim:

1. The radial lead component insertion machine for selection of radial leaded components from storage and insertion of the leads of said components into predrilled holes in a printed circuit board, comprising:

means for supporting and laterally positioning a printed circuit board, whereby the x–y positions of said printed circuit board are determined;

a storage unit, holding a component strip, said component strip including a backing strip with the component leads transversely attached thereto with the component bodies extending away from said backing strip, said components being of one size and type and spaced uniformly along said backing strip, and perforations in said backing strip, one perforation located between each of said components, one end of said component strip being accessible at an interface;

a shuttle, said shuttle, when directed, moving between said interface and a pick-up area adjacent said circuit board, said shuttle including means for moving one of said components adjacent said interface into said shuttle;

first cutting means for severing said component strip at said interface whereby said component in said shuttle is separated from the remainder of said component strip in said storage unit;

second cutting means for severing the leads of said component in said shuttle whereby said component in said shuttle is separated from said backing strip;

an insertion head adjacent said pick-up area, said insertion head having a gripper for clasping said shuttle-held component and means for inserting the leads of said component into said predrilled holes in said circuit board, and for releasing said component from said gripper;

and control means to direct said means for positioning said circuit board, said shuttle, said cutting means, and said insertion head;

whereby said circuit board is positioned; said shuttle moves to said interface and draws in one of said components from storage; said first cutting means severs said one component from the remainder of said component strip; said shuttle moves with said selected component to said pick-up area; said insertion head grips said component while said second cutting means separates said component from said backing strip; said insertion heads inserts said component leads into said predrilled holes in said circuit board, releases said component, and withdraws.

2. The insertion machine of claim 1 wherein said gripper of said insertion head clasps the leads of said component in said shuttle during insertion, whereby components of many body shapes may be inserted without gripper modification.

3. The insertion machine of claim 1 wherein said means for moving said one component into said shuttle includes a pulling finger for engaging one of said perforations in said component strip.

4. The insertion machine of claim 1 wherein said means for moving said one component into said shuttle, advances the remainder of said component strip toward said interface, whereby said machine can be directed by said control means to repetitively select components adjacent said interface from said component strip and insert said components in said circuit board.

5. The insertion machine of claim 1, and further including a plurality of said component strips carrying different components held in said storage unit, one end of each of said plurality of component strips being located at said interface, means allowing said shuttle to select components as directed from any of said component strips at said interface whereby said circuit board is populated as directed in repetitive operating cycles with a variety and plurality of said components.

6. The insertion machine of claim 5 wherein said uniform spacing of said components along said backing strip differs from component strip to component strip, and the spacing between said perforations differs from strip to strip, and said means for moving said components into said shuttle includes a pulling finger for engaging one of said perforations in said component strip, and means for varying the stroke of said pulling finger whereby the different perforation spacings are accommodated.

7. The insertion machine of claim 1 wherein said gripper is rotatable whereby components clasped by said gripper can be inserted into said circuit board with the component leads oriented to the X or y axis.

8. The insertion machine of claim 1 wherein said first cutting means includes a cutter on said shuttle and a cutter block for shearing against mounted on said storage unit.

9. The insertion machine of claim 2 wherein said second cutter means is mounted on said shuttle, said second cutter means including ridges positioned to drive said component leads into said gripper for clasping during the cutting stroke of said second cutter means.

10. The insertion machine of claim 2, wherein said gripper comprises an individual jaw for each component lead.

11. The insertion machine of claim 2 wherein said gripper includes a plurality of individual jaws, one jaw for each component lead, said plurality of jaws being unilaterally positioned, side by side, whereby the 'footprint' of the gripper at said circuit board during component insertion is reduced.

12. The insertion machine of claim 1 wherein said means in said insertion lead for inserting the leads of said component includes a pusher rod for acting on the top of said component to drive said component leads into said circuit board holes.

13. The radial lead component insertion machine for selection of radial leaded components from storage and insertion of the leads of said components into predrilled holes in a printed circuit board, comprising:

means for supporting and laterally positioning a printed circuit board, whereby the x-y positions of said printed circuit board are determined;

a storage unit, holding a component strip, said component strip including a backing strip with the component leads transversely attached thereto with the component bodies extending away from said backing strip, said components being of one size and type and spaced uniformly along said backing strip, and perforations in said backing strip, one perforation located between each of said components, one end of said component strip being accessible at an interface;

a shuttle, said shuttle, when directed, moving between said interface and a pick-up area adjacent said circuit board, said shuttle including a pulling finger for engaging one of said perforations in said component strip and pulling one of said components adjacent said interface into said shuttle, said pulling motion advancing the remainder of said component strip toward said interface, whereby said machine can be directed by said control means to repetitively select components adjacent said interface from said component strip and insert said components in said circuit board;

first cutting means for severing said component strip at said interface whereby said component in said shuttle is separated from the remainder of said component strip in said storage unit, said first cutting means including a cutter on said shuttle and a cutter block for shearing against, mounted on said storage unit;

an insertion head adjacent said pick-up area, said insertion head having a gripper for clasping the leads of said shuttle-head component and means for inserting said component into said predrilled holes in said circuit board, and for releasing said component from said gripper; said gripper including a plurality of individual jaws, one for each component lead, said plurality of jaws being unilaterally positioned, side by side, whereby the 'footprint' of the gripper at said circuit board during component insertion is reduced; said means for insertion including a pusher rod for acting on the top of said component to drive said component leads into said circuit board holes;

second cutting means mounted on said shuttle for severing the leads of said component in said shuttle whereby said component in said shuttle is separated from said backing strip, said second cutter means including ridges positioned to drive said component leads into said gripper jaws for clasping during the cutting stroke of said second cutting means;

and control means to direct said means for positioning said circuit board, said shuttle, said cutting means, and said insertion head whereby said circuit board is positioned; said shuttle moves to said interface and draws in one of said components from storage, and advances said component strip, said first cutting means severs said one component from the remainder of said component strip, said shuttle moves with said selected component to said pick-up area; said insertion head grips said component by its leads and said second cutting means separates said component from said backing strip; said insertion head pushes said component leads into said predrilled holes in said circuit board and withdraws.

14. The insertion machine of claim 13 and further comprising a plurality of said component strips carrying different components held in said storage unit, one end of each of said plurality of component strips being located at said interface, means allowing said shuttle to select components as directed from any of said component strips whereby said circuit board is populated as directed in repetitive operating cycles with a variety and plurality of said components.

15. The insertion machine of claim 14 wherein said uniform spacing of said components along said backing strip differs from component strip to component strip, and the spacing between said perforations differs from strip to strip, and further comprising means for varying the stroke of said pulling finger whereby the different perforation spacings are accommodated.

16. The insertion machine of claim 13 wherein said gripper is rotatable, whereby components clasped by said gripper can be inserted into said circuit board with the component leads oriented to the x or y axis.

17. The insertion machine of claim 13 and further comprising detector means, said detector indicating the presence of a component drawn into said shuttle by said finger.

* * * * *